(12) United States Patent
Yamazaki et al.

(10) Patent No.: US 12,396,262 B2
(45) Date of Patent: *Aug. 19, 2025

(54) SEMICONDUCTOR DEVICE

(71) Applicant: Semiconductor Energy Laboratory Co., Ltd., Kanagawa-ken (JP)

(72) Inventors: Shunpei Yamazaki, Tokyo (JP);
Kiyoshi Kato, Kanagawa (JP);
Masayuki Sakakura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 62 days.

This patent is subject to a terminal disclaimer.

(21) Appl. No.: 18/224,224

(22) Filed: Jul. 20, 2023

(65) Prior Publication Data

US 2023/0369342 A1 Nov. 16, 2023

Related U.S. Application Data

(63) Continuation of application No. 17/365,149, filed on Jul. 1, 2021, now Pat. No. 11,710,744, which is a
(Continued)

(30) Foreign Application Priority Data

Dec. 2, 2015 (JP) .................. 2015-235300

(51) Int. Cl.
*H10D 86/60* (2025.01)
*H10B 12/00* (2023.01)
(Continued)

(52) U.S. Cl.
CPC ............. *H10D 86/60* (2025.01); *H10B 12/30* (2023.02); *H10D 30/6755* (2025.01); *H10D 86/423* (2025.01); *H10D 86/481* (2025.01)

(58) Field of Classification Search
CPC ................................ H01L 28/82; H01L 28/75
See application file for complete search history.

(56) References Cited

U.S. PATENT DOCUMENTS 5,240,871 A   8/1993  Doan et al.
5,460,999 A  10/1995  Hong et al.
(Continued)

FOREIGN PATENT DOCUMENTS

EP    0 697 720 A1     2/1996
JP    05-335510 A     12/1993
(Continued)

OTHER PUBLICATIONS

Brain, R. et al., "A 22nm High Performance Embedded DRAM SoC Technology Featuring Tri-gate Transistors and Mimcap Cob," 2013 Symposium on VLSI Technology: Digest of Technical Papers, Jun. 11, 2013, pp. T16-T17.

*Primary Examiner* — Yu-Hsi D Sun
(74) *Attorney, Agent, or Firm* — Husch Blackwell LLP

(57) ABSTRACT

A semiconductor device that is suitable for miniaturization and higher density is provided. A semiconductor device includes a first transistor over a semiconductor substrate, a second transistor including an oxide semiconductor over the first transistor, and a capacitor over the second transistor. The capacitor includes a first conductor, a second conductor, and an insulator. The second conductor covers a side surface of the first conductor with an insulator provided therebetween.

16 Claims, 32 Drawing Sheets

Related U.S. Application Data continuation of application No. 16/927,513, filed on Jul. 13, 2020, now Pat. No. 11,056,510, which is a continuation of application No. 15/366,418, filed on Dec. 1, 2016, now Pat. No. 10,714,502.

(51) Int. Cl.
*H10D 30/67* (2025.01)
*H10D 86/40* (2025.01)

(56) References Cited

U.S. PATENT DOCUMENTS

| | | | |
|---|---|---|---|
| 5,585,300 | A | 12/1996 | Summerfelt |
| 5,665,628 | A | 9/1997 | Summerfelt |
| 5,757,456 | A | 5/1998 | Yamazaki et al. |
| 5,793,057 | A | 8/1998 | Summerfelt |
| 5,851,878 | A * | 12/1998 | Huang .............. H01L 27/10817 438/255 |
| 5,952,722 | A | 9/1999 | Watanabe |
| 5,998,825 | A | 12/1999 | Ochiai |
| 6,287,934 | B1 | 9/2001 | Ochiai |
| 6,317,948 | B1 | 11/2001 | Kola et al. |
| 6,583,458 | B1 | 6/2003 | Hayashi et al. |
| 7,037,752 | B2 | 5/2006 | Kuwabara et al. |
| 7,118,957 | B2 | 10/2006 | Hayashi et al. |
| 7,361,552 | B2 | 4/2008 | Hayashi et al. |
| 7,422,935 | B2 | 9/2008 | Yamazaki |
| 7,485,838 | B2 | 2/2009 | Nishi et al. |
| 7,683,838 | B2 | 3/2010 | Koyama et al. |
| 7,785,938 | B2 | 8/2010 | Yamaguchi et al. |
| 8,754,409 | B2 | 6/2014 | Yamazaki et al. |
| 8,780,614 | B2 | 7/2014 | Takemura |
| 9,287,408 | B2 | 3/2016 | Yamazaki et al. |
| 9,349,418 | B2 | 5/2016 | Yamamoto et al. |
| 9,425,107 | B2 | 8/2016 | Matsubayashi |
| 9,443,872 | B2 | 9/2016 | Miyairi |
| 9,502,434 | B2 | 11/2016 | Tanaka et al. |
| 9,548,395 | B2 | 1/2017 | Yamazaki et al. |
| 9,672,873 | B2 | 6/2017 | Yamamoto et al. |
| 9,716,100 | B2 | 7/2017 | Atsumi et al. |
| 9,799,685 | B2 | 10/2017 | Miyairi |
| 9,812,458 | B2 | 11/2017 | Matsubayashi |
| 9,859,443 | B2 | 1/2018 | Yamazaki et al. |
| 9,954,111 | B2 | 4/2018 | Yamazaki et al. |
| 10,079,238 | B2 | 9/2018 | Matsubayashi |
| 10,388,797 | B2 | 8/2019 | Yamazaki et al. |
| 2002/0017670 | A1 | 2/2002 | Bhowmik et al. |
| 2005/0151228 | A1 | 7/2005 | Tanida et al. |
| 2007/0229271 | A1 | 10/2007 | Shionoiri et al. |
| 2007/0284721 | A1 | 12/2007 | Sakamoto |
| 2009/0114926 | A1 | 5/2009 | Yamazaki |
| 2010/0213531 | A1 | 8/2010 | Asami et al. |
| 2010/0273319 | A1 | 10/2010 | Mikami et al. |
| 2010/0282947 | A1 | 11/2010 | Yamazaki et al. |
| 2010/0289037 | A1 | 11/2010 | Matsumoto et al. |
| 2010/0320496 | A1 | 12/2010 | Nishi et al. |
| 2012/0091543 | A1 | 4/2012 | Torashima et al. |
| 2012/0248581 | A1 | 10/2012 | Sugiyama et al. |
| 2012/0261802 | A1 | 10/2012 | Ohmi et al. |
| 2012/0264247 | A1 | 10/2012 | Peng et al. |
| 2013/0221356 | A1 | 8/2013 | Yamazaki et al. |
| 2015/0187775 | A1 | 7/2015 | Yamamoto et al. |
| 2015/0255490 | A1 * | 9/2015 | Miyairi .............. H01L 27/1225 257/43 |
| 2016/0149044 | A1 | 5/2016 | Noda |

FOREIGN PATENT DOCUMENTS

| | | |
|---|---|---|
| JP | 05-347392 A | 12/1993 |
| JP | 08-116032 A | 5/1996 |
| JP | 09-027597 A | 1/1997 |
| JP | 10-242411 A | 9/1998 |
| JP | 11-026721 A | 1/1999 |
| JP | 11-261001 A | 9/1999 |
| JP | 2000-188383 A | 7/2000 |
| JP | 2003-336016 A | 11/2003 |
| JP | 2007-096055 A | 4/2007 |
| JP | 2007-123861 A | 5/2007 |
| JP | 2012-178554 A | 9/2012 |
| JP | 2012-216802 A | 11/2012 |
| JP | 2012-256847 A | 12/2012 |
| JP | 2015-111663 A | 6/2015 |
| JP | 2015-164181 A | 9/2015 |
| JP | 2015-187902 A | 10/2015 |
| JP | 2015-188070 A | 10/2015 |
| JP | 2015-195074 A | 11/2015 |
| JP | 2015-195365 A | 11/2015 |
| JP | 2015-213164 A | 11/2015 |
| WO | WO-2012/121265 | 9/2012 |
| WO | WO 2015/159179 A1 | 10/2015 |

* cited by examiner crystal structure of In$M$ZnO$_4$

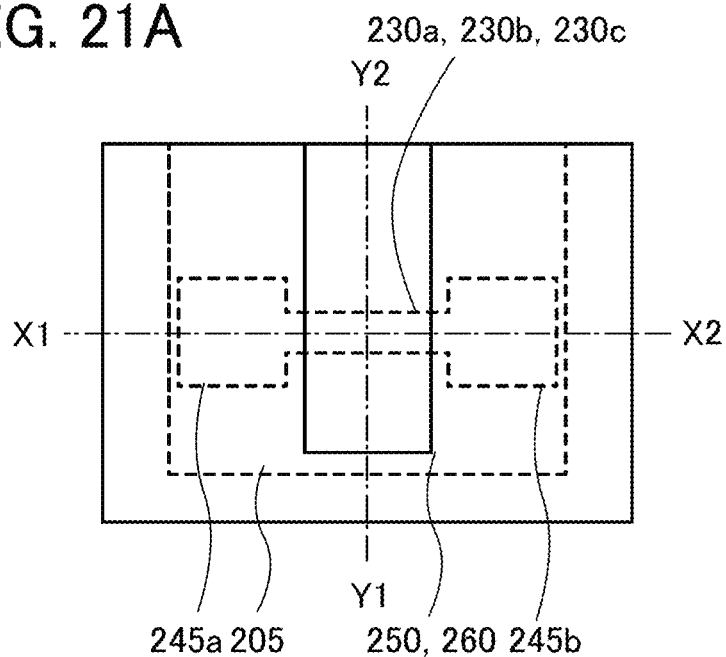
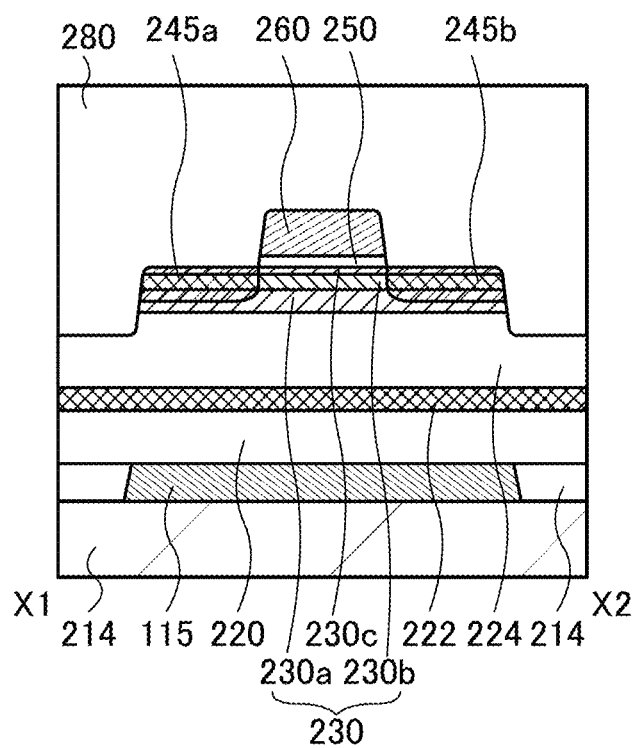
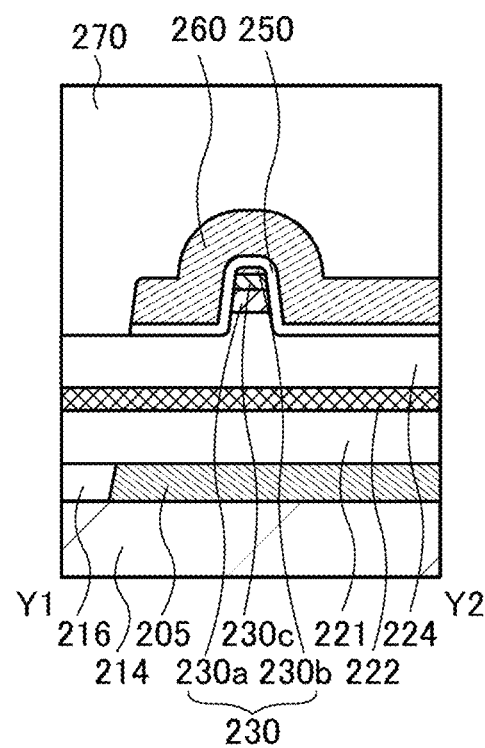

FIG. 22A  out-of-plane method CAAC-OS
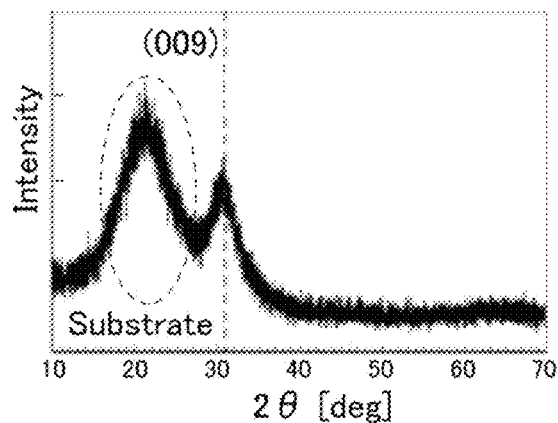
FIG. 22B  in-plane method φ scan CAAC-OS
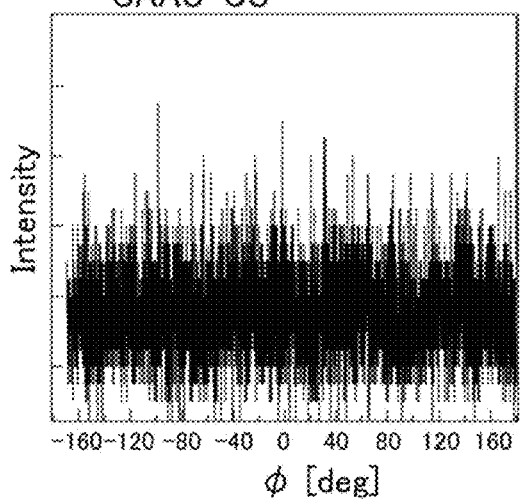
FIG. 22C  in-plane method φ scan single crystal OS
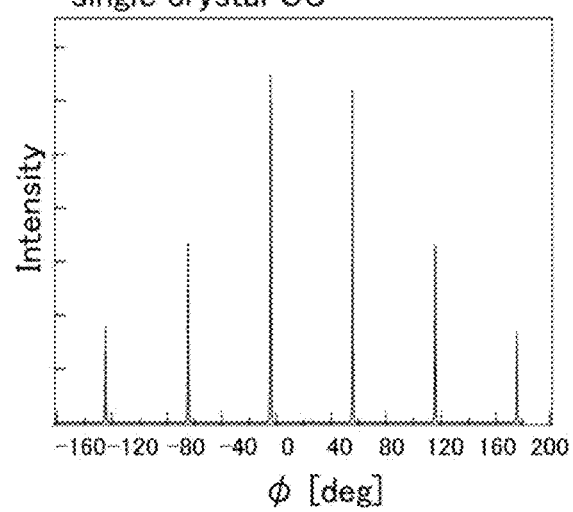
FIG. 22D
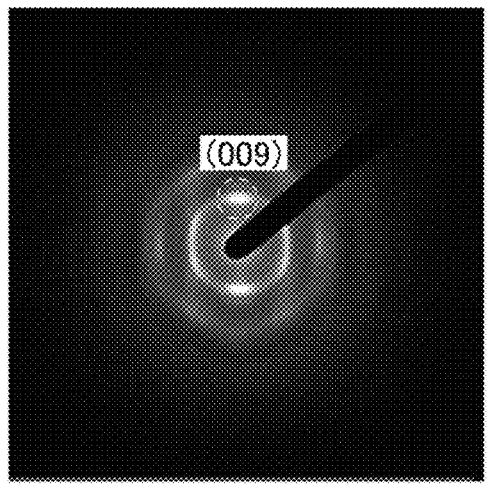
FIG. 22E
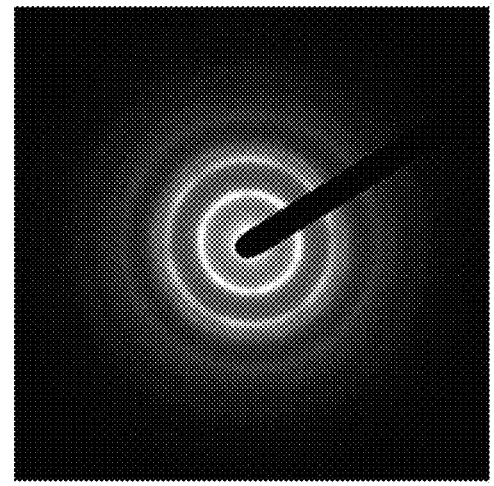

SEMICONDUCTOR DEVICE

This application is a continuation of copending U.S. application Ser. No. 17/365,149, filed on Jul. 1, 2021 which is a continuation of U.S. application Ser. No. 16/927,513, filed on Jul. 13, 2020 (now U.S. Pat. No. 11,056,510 issued Jul. 6, 2021) which is a continuation of U.S. application Ser. No. 15/366,418, filed on Dec. 1, 2016 (now U.S. Pat. No. 10,714,502 issued Jul. 14, 2020) which are all incorporated herein by reference.

BACKGROUND OF THE INVENTION

1. Field of the Invention

One embodiment of the present invention relates to a semiconductor device including a capacitor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, a method for manufacturing any of them, and the like.

In this specification and the like, a semiconductor device generally means a device that can function by utilizing semiconductor characteristics. A semiconductor element such as a transistor, a semiconductor circuit, an arithmetic device, and a memory device are embodiments of a semiconductor device. An imaging device, a display device, a liquid crystal display device, a light-emitting device, an electro-optical device, a power generation device (including a thin film solar cell, an organic thin film solar cell, and the like), an electronic device, and the like may each include a semiconductor device.

2. Description of the Related Art

A technique in which a transistor is formed using a semiconductor material has attracted attention. The transistor is applied to a wide range of electronic devices such as integrated circuits (ICs) or image display devices (also simply referred to as display devices). A silicon-based semiconductor material is widely known as a semiconductor material applicable to the transistor. As another material, an oxide semiconductor has attracted attention.

For example, a technique in which a transistor is formed using zinc oxide or an In—Ga—Zn-based oxide semiconductor as an oxide semiconductor is disclosed (see Patent Documents 1 and 2).

In addition, in recent years, demand for integrated circuits in which semiconductor elements such as miniaturized transistors are integrated with high density has risen with an increase in performance and reductions in size and weight of electronic devices. For example, a tri-gate transistor and a capacitor-over-bitline (COB) MIM capacitor are reported (Non-Patent Document 1).

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1]
R. Brain et al., "A 22 nm High Performance Embedded DRAM SoC Technology Featuring Tri-gate Transistors and MIMCAP COB", 2013 SYMPOSIUM ON VLSI TECHNOLOGY: DIGEST OF TECHNICAL PAPERS, 2013, pp. T16-T17

SUMMARY OF THE INVENTION

An object of one embodiment of the present invention is to provide a semiconductor device that is suitable for miniaturization and high-density integration.

Another object of one embodiment of the present invention is to provide a semiconductor device with favorable electrical characteristics. Another object of one embodiment of the present invention is to provide a highly reliable semiconductor device. Another object of one embodiment of the present invention is to provide a semiconductor device with a novel structure. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention includes a first transistor over a semiconductor substrate, a second transistor including an oxide semiconductor over the first transistor, a capacitor over the second transistor. The capacitor includes a first conductor, a second conductor, and an insulator. The second conductor covers a side surface of the first conductor with the insulator provided therebetween.

One embodiment of the present invention includes a first transistor over a semiconductor substrate, a second transistor including an oxide semiconductor over the first transistor, an interlayer film over the second transistor, and a capacitor over the interlayer film. The capacitor includes a first conductor, a second conductor, and an insulator. A top surface of a second conductor in a region overlapping with the interlayer film and the insulator is under a bottom surface of the first conductor in a region overlapping with the interlayer film and the first conductor.

In the above embodiment, the insulator has a stacked-layer structure of a material with high dielectric strength and a high-k material.

In the above embodiment, a first interlayer film having a barrier property and a wiring having a barrier property are included between the first transistor and the second transistor.

In the above embodiment, a second interlayer film having a barrier property is included between the capacitor and the second transistor.

In the above embodiment, the interlayer film in the vicinity of the second transistor contains excess oxygen.

An electronic device includes the above semiconductor device of the present invention, and at least one of a display device, a microphone, a speaker, an operation key, a touch panel, and an antenna.

According to one embodiment of the present invention, a semiconductor device that is suitable for miniaturization and higher density can be provided. Alternatively, degradation of electrical characteristics of the semiconductor device due to miniaturization can be suppressed.

A semiconductor device with excellent electrical characteristics can be provided. Alternatively, a highly reliable semiconductor device can be provided. A semiconductor device or the like with a novel structure can be provided. A novel semiconductor device and the like can be provided. Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 21A to 21C illustrate a top view structure and cross-sectional structures of a transistor according to one embodiment.

FIGS. 22A to 22E show structural analysis of a CAAC-OS and a single crystal oxide semiconductor by XRD and selected-area electron diffraction patterns of a CAAC-OS.

DETAILED DESCRIPTION OF THE INVENTION

Figure 1A:
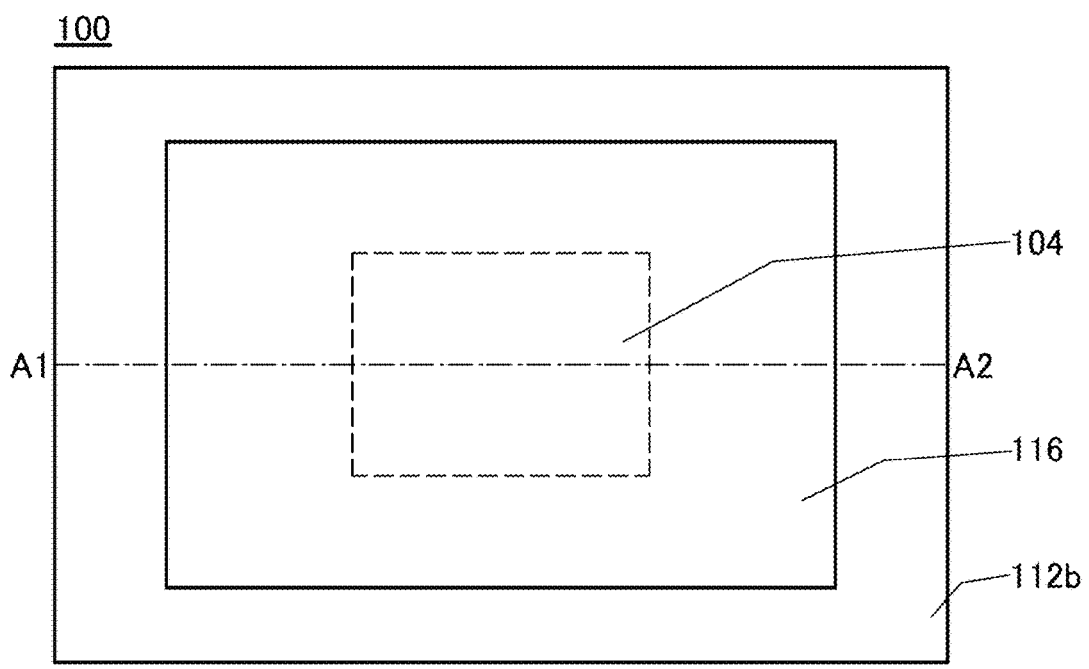
FIGS. 1A to 1C illustrate a top view structure and cross-sectional structures of a capacitor according to one embodiment.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" means that the angle formed between two straight lines is greater than or equal to 80° and less than or equal to 100°. Thus, the case where the angle is greater than or equal to 85° and less than or equal to 950 is also included. In addition, the term "substantially perpendicular" indicates that the angle formed between two straight lines is greater than or equal to 600 and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, a load and the like) is not connected between X and Y, and the case where X and Y are connected without the element that allows the electrical connection between X and Y (e.g., a switch, a transistor, a capacitor, an inductor, a resistor, a diode, a display element, a light-emitting element, a load and the like) provided therebetween.

In the case where X and Y are electrically connected, one or more elements that enable an electrical connection between X and Y (e.g., a switch, a transistor, a capacitor, an inductor, a resistor, a diode, a display element, a light-emitting element, a load element and the like) can be connected between X and Y, for example. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, and a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y For example, even when another circuit is interposed between X and Y, X and Y are functionally connected if a signal output from X is transmitted to Y Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

Structure Example

Figure 1B:
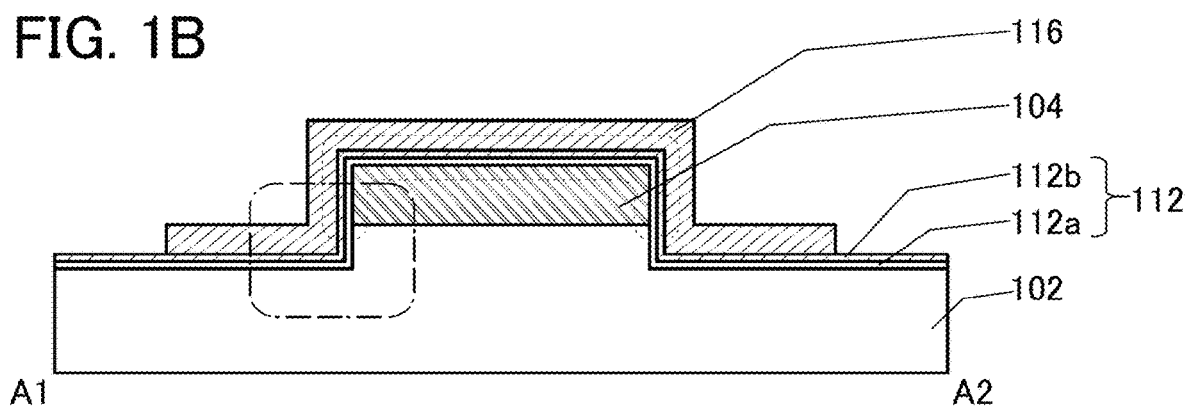
Figure 1C:
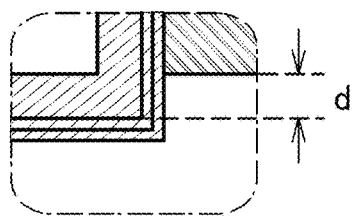

FIG. 1A is an example of a top view of a capacitor 100. FIG. 1B is a cross-sectional view taken along dashed-dotted line A1-A2 shown in FIG. 1A. FIG. 1C is an enlarged view of a region surrounded by a dashed-dotted line shown in FIG. 1B.

The capacitor 100 is provided over an insulator 102 and includes a conductor 104, an insulator 112, and a conductor 116. The insulator 112 includes an insulator 112a and an insulator 112b.

The conductor 104 can be formed using a conductive material such as a metal material, an alloy material, or a metal oxide material. It is preferable to use a high-melting-point material which has both heat resistance and conductivity such as tungsten or molybdenum, and it is particularly preferable to use tungsten. Furthermore, when the conductor 104 is formed simultaneously with another component such as a plug or a wiring, a low-resistance metal material such as copper (Cu) or aluminum (Al) may be used.

The insulator 112 is provided to cover the side surfaces and the top surface of the conductor 104. The insulator 112 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

In the case of a two-layer structure shown in FIGS. 1A to 1C, the insulator 112a can be formed using a high dielectric constant (high-k) material such as aluminum oxide and the insulator 112b can be formed using a material with high dielectric strength such as silicon oxynitride, for example. With this structure, the capacitor 100 can have sufficient capacitance by including the insulator 112a, and high dielectric strength is improved and electrostatic breakdown of the capacitor 100 can be inhibited by including the insulator 112b.

The conductor 116 is provided to cover the side surfaces and the top surface of the conductor 104 with the insulator 112 provided therebetween. Note that as shown in FIG. 1C, it is preferable to provide the distance "d" between the top surface of the insulator 112 in a region where the insulator 102 is in contact with the insulator 112 and the bottom surface of the conductor 104 in a region where the insulator 112 is in contact with the conductor 104 is more than or equal to 0.

With this structure, the side surfaces of the conductor 104 are covered by the conductor 116 with the insulator 112 provided therebetween. Accordingly, in the capacitor 100, a capacitor having a large capacitance per projected area can be formed because the region surrounded by the dashed-dotted line (the sum of the area of the top surface and the side surfaces of the conductor 104) shown in FIG. 1B functions as a storage capacitor.

The conductor 116 can be formed using a conductive material such as a metal material, an alloy material, or a metal oxide material. It is preferable to use a high-melting-point material which has both heat resistance and conductivity such as tungsten or molybdenum, and it is particularly preferable to use tungsten. Furthermore, when the conductor 116 is formed simultaneously with another component such as a conductor, a low-resistance metal material such as copper (Cu) or aluminum (Al) may be used.

The conductor 116 covers the side surfaces and the top surface of the conductor 104 with the insulator 112 provided therebetween, whereby a capacitor per projected area of the capacitor 100 can be increased. Thus, the semiconductor device can be reduced in area, highly integrated, and miniaturized.

The above is the description of the structure example.

Modification Example 1

Figure 2A:
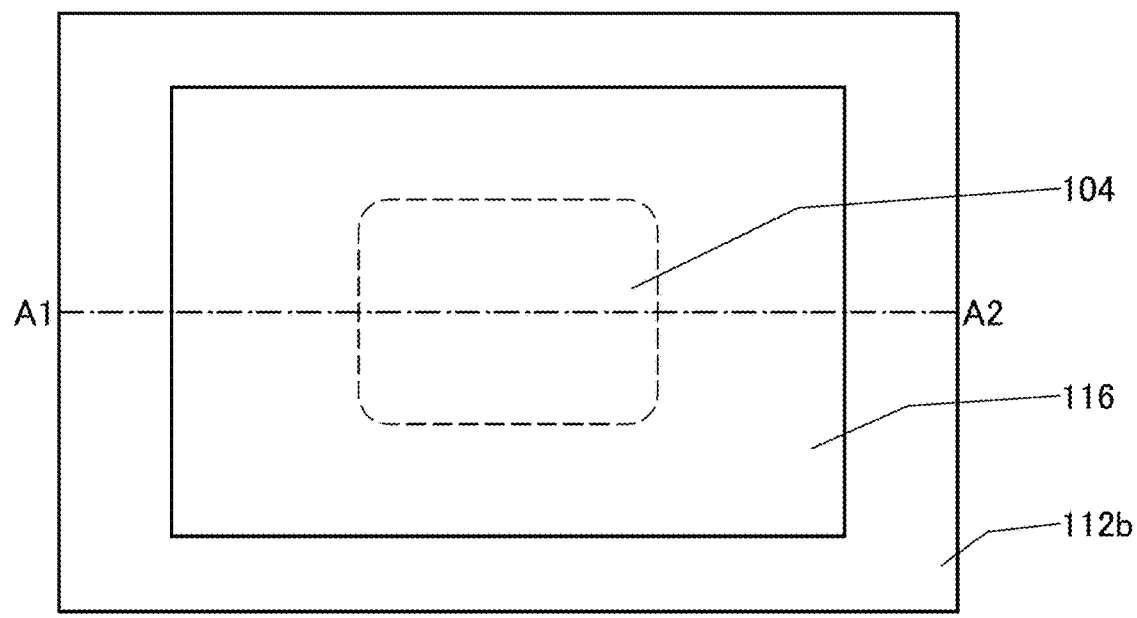
FIGS. 2A and 2B illustrate a top view structure and a cross-sectional structure of a capacitor according to one embodiment.
Figure 2B:
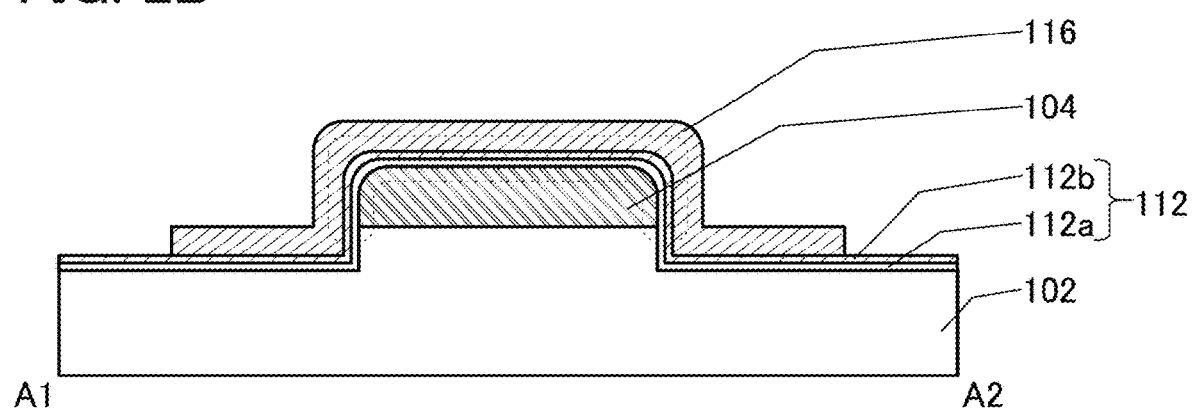

In a modification example of this embodiment, the corner portions of the conductor 104 may be round as shown in FIGS. 2A and 2B. When the corner portion of the conductor 104 is round, a high dielectric strength of the capacitor 100 is improved because coverage by the insulator 112 and the conductor 116 formed over the conductor 104 is improved.

With this structure, electrostatic breakdown of the capacitor 100 can be inhibited, whereby the reliability of a semiconductor device can be improved.

Modification Example 2

Figure 3A:
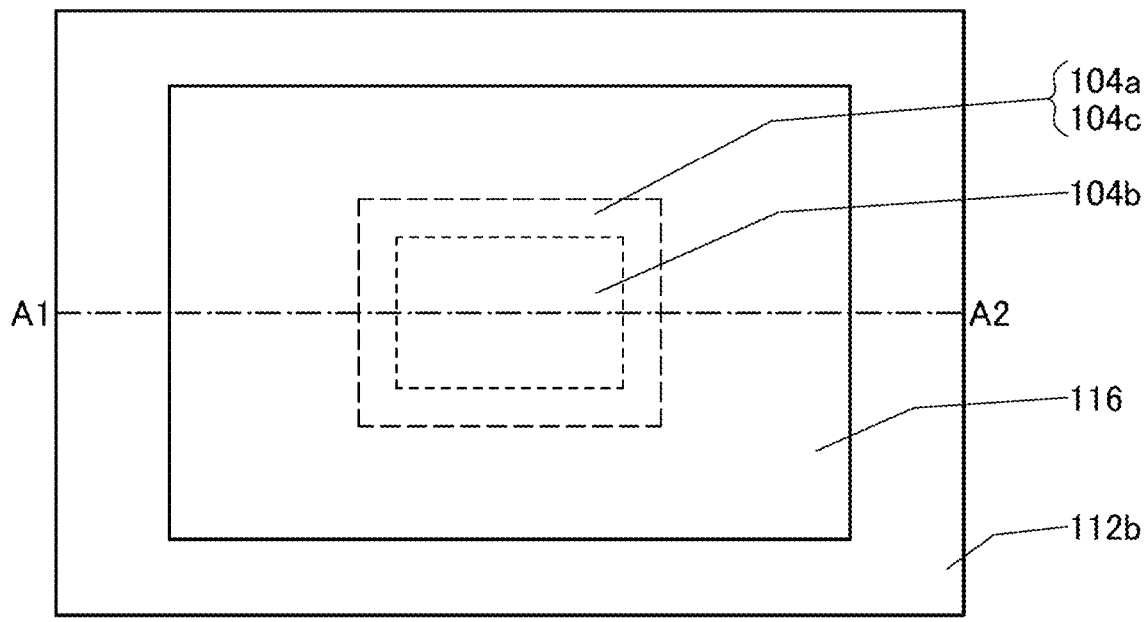
FIGS. 3A and 3B illustrate a top view structure and a cross-sectional structure of a capacitor according to one embodiment.
Figure 3B:
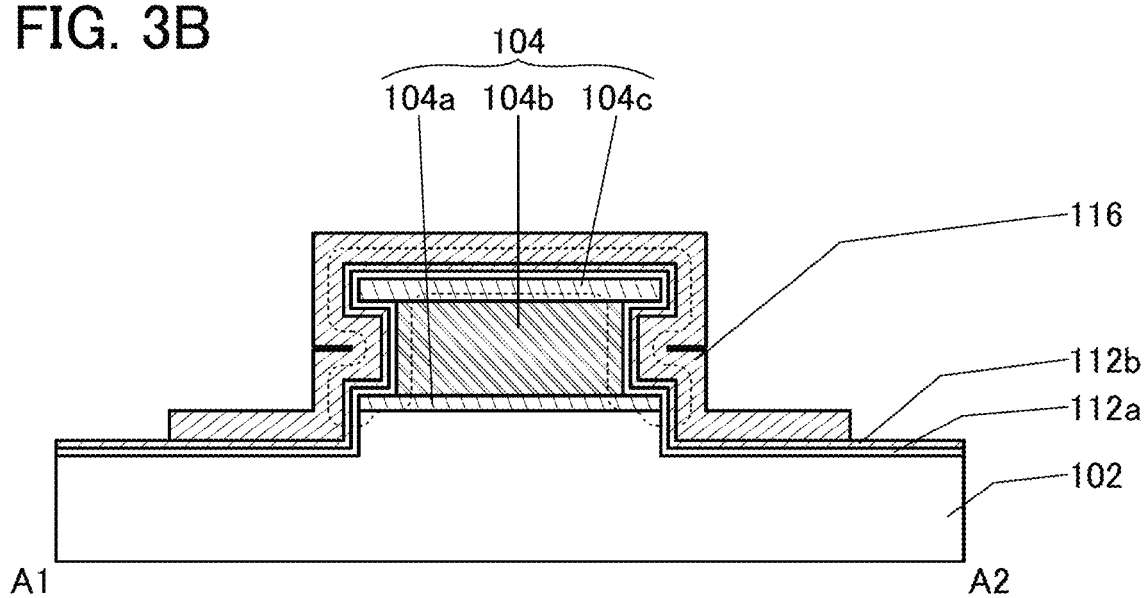

In a modification example of this embodiment, the area of side surfaces can be increased by providing depression portions on the side surfaces of the conductor 104. For example, a conductor 104b is provided over a conductor 104a so that the side surfaces can be positioned inside of those of the conductor 104a and a conductor 104c as shown in FIGS. 3A and 3B. With this structure, the conductor 116 covers part of the top surface of the conductor 104a and part of the bottom surface of the conductor 104c with the insulator 112 provided therebetween. Accordingly, the capacitance of the capacitor per projected area can be increased.

Although the three-layer structure of the conductor 104 is shown in FIGS. 3A and 3B, a stacked-layer structure of four or more layers may be used.

With the above structure, the capacitance of the capacitor 100 per projected area can be increased, leading to a reduction in area, higher integration, and miniaturization of a semiconductor device.

Modification Example 3

Figure 4A:
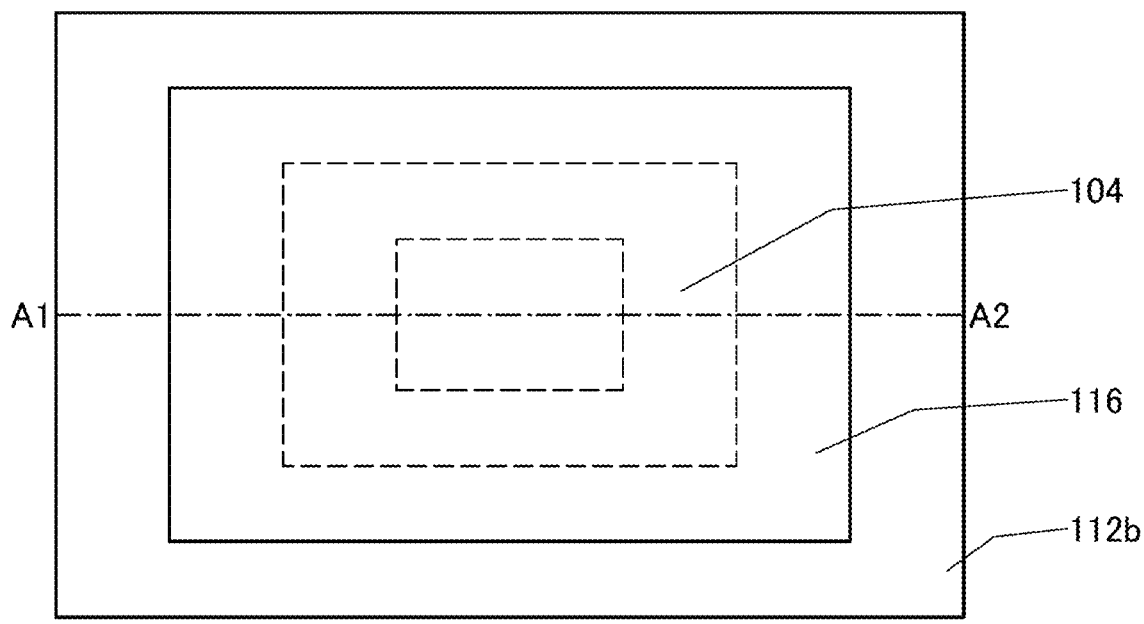
FIGS. 4A and 4B illustrate a top view structure and a cross-sectional structure of a capacitor according to one embodiment.
Figure 4B:
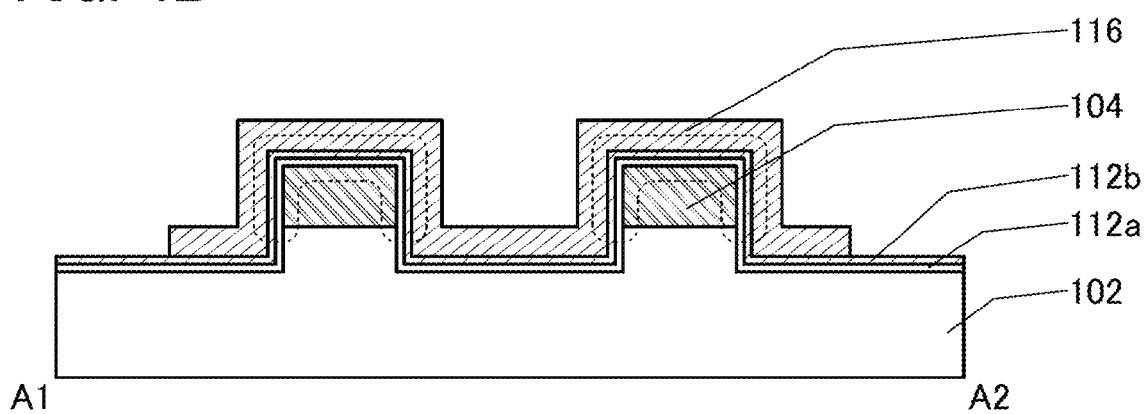

In a modification example of this embodiment, the area of side surfaces of the conductor 104 can be increased by processing the shape of the conductor 104. For example, an opening may be formed in the conductor 104 as shown in FIGS. 4A and 4B. In the case where the area of side surfaces on the side of the opening are larger than the area of the top surface is to be reduced by the opening, the capacitance of the capacitor per projected area can be increased.

Although a rectangular opening is provided on the conductor 104 in FIGS. 4A and 4B, the shape of the opening may be polygonal or circular.

For example, the conductor may have plural openings as shown in FIGS. 5C to 5L. In particular, when the openings are provided in the minimum feature size, the capacitance can be efficiently increased in a lattice shape shown in FIGS. 5G and 5H.

Figure 5A:
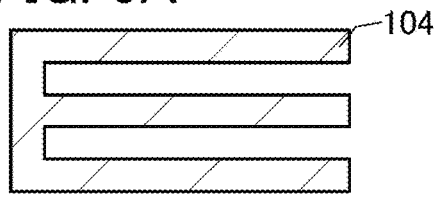
FIGS. 5A to 5L each illustrate a top view surface of a capacitor according to one embodiment.
Figure 5B:
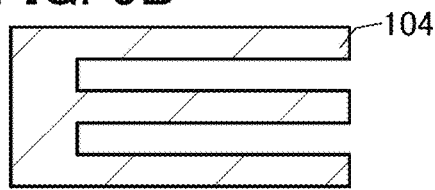
Figure 5C:
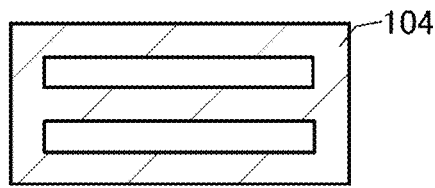
Figure 5D:
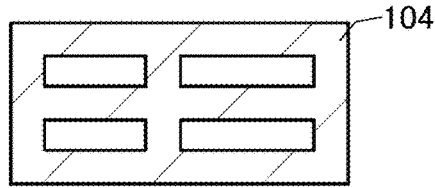
Figure 5E:
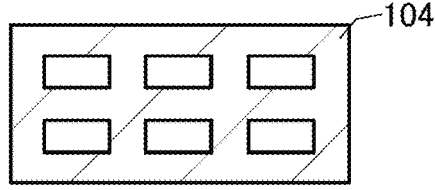
Figure 5F:
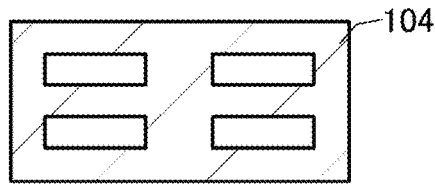
Figure 5G:
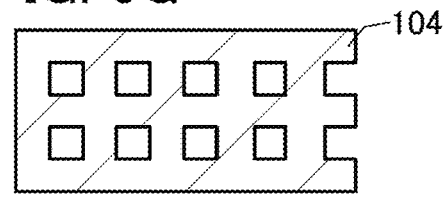
Figure 5H:
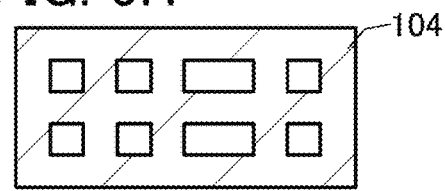
Figure 5I:
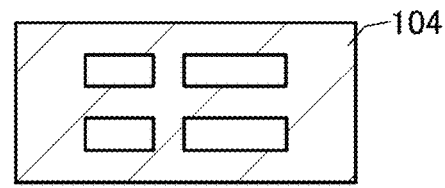
Figure 5J:
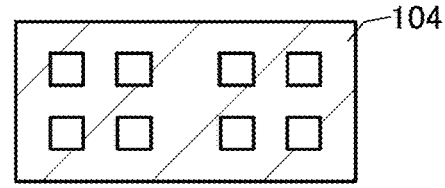
Figure 5K:
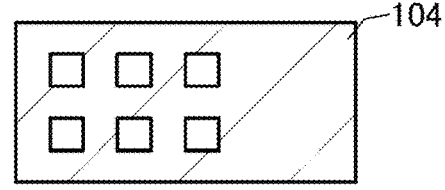
Figure 5L:
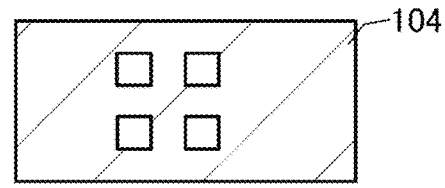

In addition, a comb-like shape as shown in FIGS. 5A and 5B may be used, for example.

With the above structure, the capacitance of the capacitor 100 per projected area can be increased, leading to a reduction in area, higher integration, and miniaturization of a semiconductor device.

Embodiment 2

In this embodiment, one embodiment of a semiconductor device is described with reference to FIGS. 6A to 6C, FIGS. 7A and 7B, FIGS. 8A to 8D, FIGS. 9A to 9C, FIGS. 10A to 10 C, FIGS. 11A and 11B, FIGS. 12A and 12B, FIGS. 13A and 13B, and FIG. 14.

Structure Example

Figure 6A:
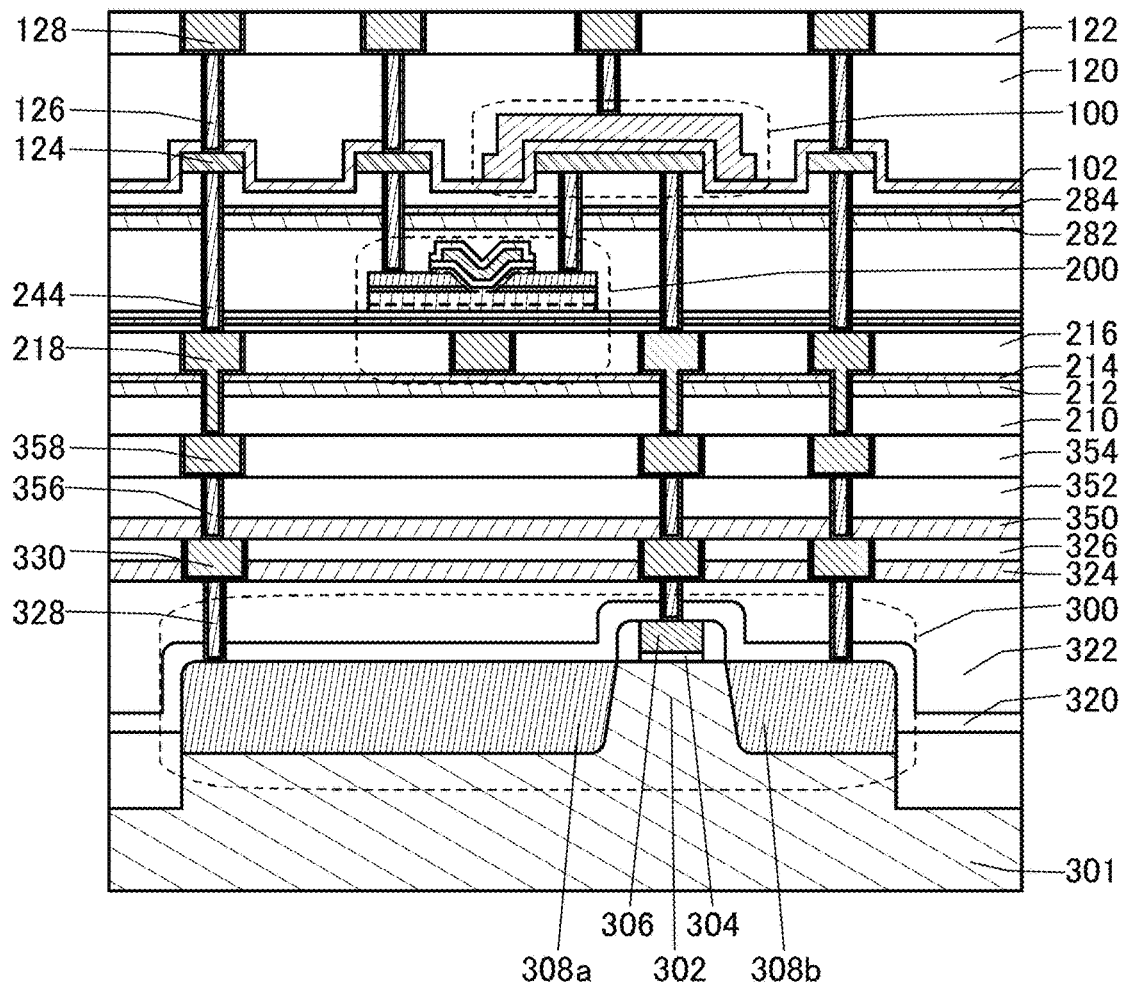
FIGS. 6A to 6C illustrate structural examples and a circuit diagram of a semiconductor device according to one embodiment.
Figure 6B:
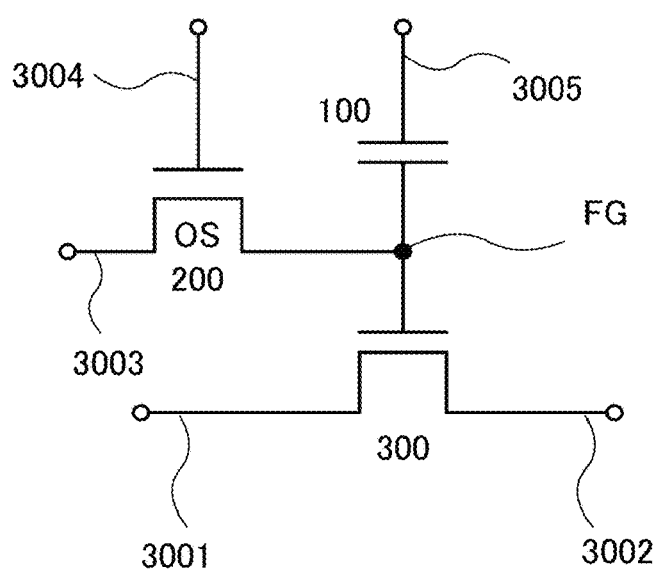
Figure 6C:
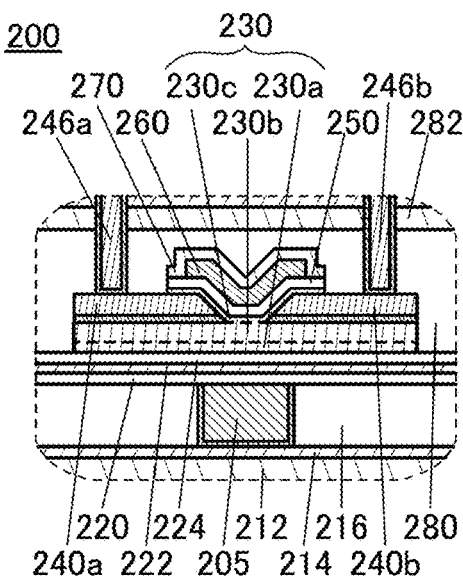

FIGS. 6A to 6C illustrate an example of a semiconductor device (memory device) in which the capacitor of one embodiment of the present invention is used. Note that FIG. 6B is a circuit diagram in FIG. 6A. FIG. 6C is an enlarged view of part of the structure in FIG. 6A.

The semiconductor device shown in FIGS. 6A and 6B includes a transistor 300, a transistor 200, and the capacitor 100. Note that the capacitor described in Embodiment 1 can be used as the capacitor 100.

The transistor 200 is a transistor in which a channel is formed in a semiconductor layer including an oxide semiconductor. Since the off-state current of the transistor 200 is small, by using the transistor 200 in the semiconductor device (memory device), stored data can be held for a long time. In other words, it is possible to reduce power consumption sufficiently because the semiconductor device (memory device) requires no refresh operation or has a need of an extremely low frequency of the refresh operation.

In FIG. 6B, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to the gate of the transistor 200. A gate of the transistor 300 and the other of the source and the drain of the transistor 200 are electrically connected to one electrode of the capacitor 100. A wiring 3005 is electrically connected to the other electrode of the capacitor 100.

When semiconductor devices each having the structure shown in FIGS. 6A and 6B are arranged in a matrix, a memory device (memory cell array) can be manufactured.

A semiconductor device of one embodiment of the present invention includes the capacitor 100 in which one electrode covers the other electrode with an insulator provided therebetween. Accordingly, the capacitor 100 has enhanced capacitance per projected area because the capacitance can be formed on the side surface of one electrode. Thus, the semiconductor device can be reduced in area, highly integrated, and miniaturized.

The semiconductor device of one embodiment of the present invention includes the transistor 300, the transistor 200, and the capacitor 100 as shown in FIG. 6A. The transistor 200 is provided over the transistor 300 and the capacitor 100 is provided over the transistor 300 and the transistor 200.

The transistor 300 is provided over a substrate 301 and includes a conductor 306, an insulator 304, a semiconductor region 302 that is formed by part of the substrate 301, and a low-resistance region 308a and a low-resistance region 308b serving as a source region and a drain region.

The transistor 300 can be a p-channel transistor or an n-channel transistor.

It is preferable that the semiconductor region 302 where a channel is formed, a region in the vicinity thereof, the low-resistance region 308a and the low-resistance region 308b serving as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance region 308a and the low-resistance region 308b contain an element which imparts n-type conductivity such as arsenic or phosphorus, or an element which imparts p-type conductivity such as boron, in addition to a semiconductor material used for the semiconductor region 302.

The conductor 306 serving as the gate electrode can be formed using a semiconductor material such as silicon containing the element that imparts n-type conductivity such as arsenic or phosphorus, or the element that imparts p-type conductivity such as boron, or a conductive material such as a metal material, an alloy material, or a metal oxide material.

Note that a material used for a conductor determines the work function, whereby a threshold voltage can be adjusted. Specifically, it is preferable to use titanium nitride, tantalum nitride, or the like for the conductor. Furthermore, in order to ensure conductivity and embeddability of the conductor, it is preferable that the conductor be a stacked-layer structure of metal materials such as tungsten and aluminum. In particular, tungsten is preferable in terms of heat resistance.

In the transistor 300 shown in FIGS. 6A to 6C, the semiconductor region 302 (part of the substrate 301) where a channel is formed includes a protruding shape. Furthermore, the conductor 306 is provided to cover the side surfaces and the top surface of the semiconductor region 302 with the insulator 304 provided therebetween. Note that a material which adjusts the work function may be used for the conductor 306. The transistor 300 is also referred to as FIN transistors because they each utilize a protruding portion of the semiconductor substrate. Note that an insulator serving as a mask for forming the protruding portion may be provided in contact with the top of the protruding portion. Although the case where the protruding portion is formed by processing part of the semiconductor substrate is described here, a semiconductor film having a protruding shape may be formed by processing an SOI substrate.

Figure 7A:
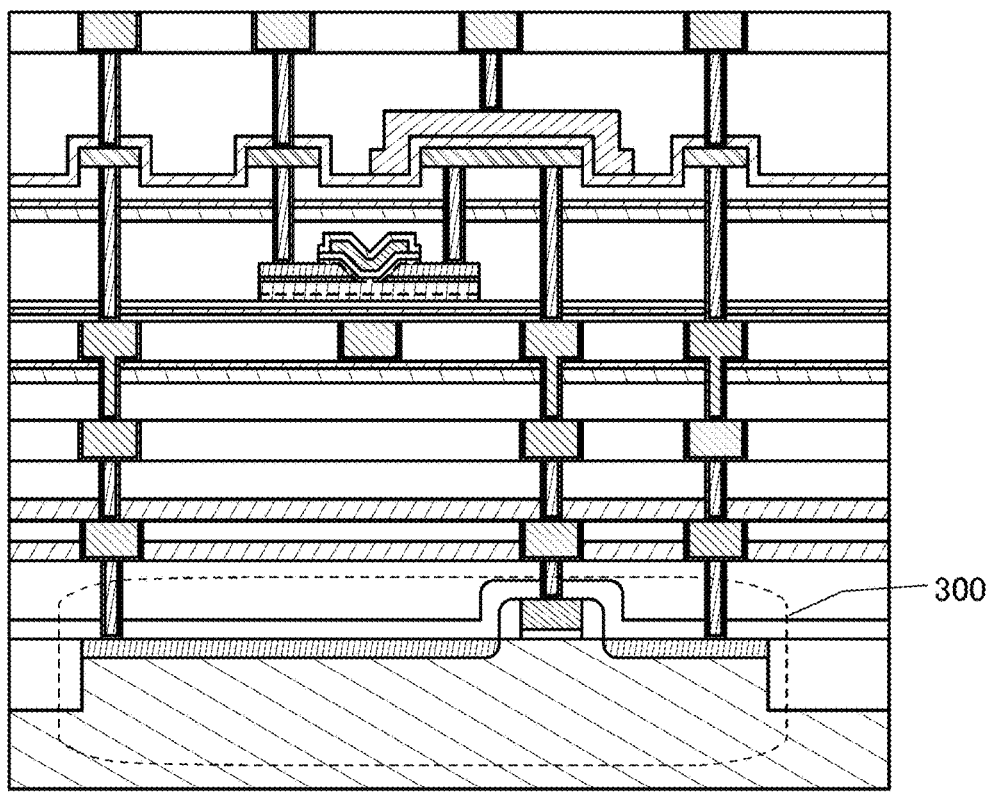
FIGS. 7A and 7B illustrate structural examples of a semiconductor device according to one embodiment.

Note that the transistor 300 shown in FIG. 6A is one example and an appropriate transistor may be used depending on the circuit configuration or the driving method without being limited to the structure. For example, the transistor 300 may be a planar transistor as shown in FIG. 7A.

An insulator 320, an insulator 322, an insulator 324, and an insulator 326 are stacked in this order to cover the transistor 300.

The insulator 322 functions as a planarization film for eliminating a level difference generated by the transistor 300 or the like provided below. A top surface of the insulator 322 may be planarized by planarization treatment using a chemical mechanical polishing (CMP) method or the like in order to increase the planarity.

The insulator 324 functions as a barrier film that prevents diffusion of hydrogen or impurities from the substrate 301 or the transistor 300 into the region where the transistor 200 is provided. For example, nitride such as silicon nitride may be used as the insulator 324.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring. For the conductor serving as a plug or a wiring, a plurality of components is denoted by the same reference numerals in some cases, which will be described later. In addition, in this specification and the like, a wiring and a plug electrically connected to the wiring may be a single component. That is, when part of the conductor functions as a wiring, part of the conductor may function as a plug.

Each plug and wiring (the conductor 328, the conductor 330, and the like) can be formed to have a single-layer structure or a stacked-layer structure using a conductive material such as a metal material, an alloy material, or a metal oxide material. It is preferable to use a high-melting-point material such as tungsten and molybdenum, which has both heat resistance and conductivity and it is particularly preferable to use tungsten. Alternatively, a low-resistance conductive material such as aluminum and copper is preferable. The use of the material as described above can reduce the wiring resistance.

A wiring layer may be provided over the insulator 326 and the conductor 330. For example, an insulator 350, an insulator 352, and an insulator 354 are stacked in this order in FIG. 6A. Furthermore, a conductor 356 and a conductor 358 are embedded in the insulator 350, the insulator 352, and the insulator 354. The conductor 356 and the conductor 358 function as a plug or a wiring.

Note that it is preferable to use an insulator having a barrier property against hydrogen as the insulator 350 like the insulator 324, for example. In addition, it is preferable to use a conductor having a barrier property against hydrogen as the conductor 356 and the conductor 358. The conductors each having a barrier property against hydrogen are formed in an opening of the insulator 350 having a barrier property against hydrogen. With this structure, the transistor 300 and the transistor 200 can be separated by a barrier layer and hydrogen diffusion from the transistor 300 to the transistor 200 can be inhibited.

Note that tantalum nitride or the like may be used for the conductor having a barrier property against hydrogen. A stack of tantalum nitride and tungsten with high conductivity can inhibit hydrogen diffusion from the transistor 300 while maintaining the conductivity of a wiring.

The transistor 200 is provided over the insulator 354. FIG. 6C illustrates an enlarged view of the transistor 200. Note that FIG. 6C is one example of the transistor 200 and an appropriate transistor may be used depending on the circuit configuration or the driving method without being limited to the structure.

An insulator 210, an insulator 212, an insulator 214, and an insulator 216 are stacked in this order over the insulator 354. Furthermore, a conductor 218, a conductor 205, and the like are embedded in the insulator 210, the insulator 212, the insulator 214, and the insulator 216. Note that the conductor 218 functions as a plug or a wiring that is electrically connected to the capacitor 100 or the transistor 300. The conductor 205 functions as a gate electrode of the transistor 200.

A material having a barrier property against oxygen and hydrogen is preferably used for any one of the insulator 210, the insulator 212, the insulator 214, and the insulator 216. In particular, when an oxide semiconductor is used for the transistor 200, the reliability of the transistor 200 can be improved with the use of an insulator having an oxygen-excess region for an interlayer film which is provided in the vicinity of the transistor 200. Accordingly, the transistor 200 and the top and the bottom sides of the interlayer film may be sandwiched between layers having a barrier property against oxygen and hydrogen so that hydrogen can be efficiently diffused from the interlayer film in the vicinity of the transistor 200 into the transistor 200

For example, aluminum oxide, hafnium oxide, or tantalum oxide may be used for the layers. Note that the reliability of the function can be increased by stacking a film having a barrier property.

An insulator 220, an insulator 222, and an insulator 224 are stacked in this order over the insulator 216. Part of a conductor 244 is embedded in the insulator 220, the insulator 222, and the insulator 224. Note that the conductor 218 functions as a plug or a wiring that is electrically connected to the capacitor 100 or the transistor 300.

Each of the insulator 220 and the insulator 224 are preferably an insulator containing oxygen such as a silicon oxide film or a silicon oxynitride film. In particular, as the insulator 224, an insulator containing excessive oxygen (containing oxygen in excess of stoichiometric composition) is preferably used. When such an insulator containing excessive oxygen is provided in contact with the oxide 230 in which a channel region of the transistor 200 is formed, oxygen vacancies in the oxide can be compensated. Note that the insulator 222 and the insulator 224 are not necessarily formed of the same material.

As the insulator 222, an insulating film containing a high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used, for example. The insulator may have a single-layer structure or a stacked-layer structure. Alternatively, for example, aluminum oxide, bismuth oxide, germanium oxide, niobium oxide, silicon oxide, titanium oxide, tungsten oxide, yttrium oxide, or zirconium oxide may be added to the insulator. Alternatively, the insulator may be subjected to nitriding treatment. A layer of silicon oxide, silicon oxynitride, or silicon nitride may be stacked over the insulator.

Note that the insulator 222 may have a stacked-layer structure of two or more layers. In that case, the stacked-layer structure is not limited to being formed of the same materials and may be formed of different materials.

When including the insulator 222 that contains a high-k material is provided between the insulator 220 and the insulator 224, electrons are trapped in the insulator 222 under the specific conditions and the threshold voltage can be increased. That is, the insulator 222 may be negatively charged.

For example, when silicon oxide is used for the insulator 220 and the insulator 224, and when a material having a lot of electron states such as hafnium oxide, aluminum oxide, or tantalum oxide is used for the insulator 222, the potential of the conductor 205 is kept higher than those of the source and drain electrode at a temperature higher than the operating temperature or the storage temperature of the semiconductor device (for example, higher than or equal to 125° C. and lower than or equal to 450° C., typically higher than or equal to 150° C. and lower than or equal to 300° C.) for longer than or equal to 10 milliseconds, typically longer than or equal to 1 minute. As a result, electrons move from the oxide 230 toward the conductor 205. Some of them are trapped by the charge trap states of the insulator 222.

In the transistor in which a necessary amount of electrons of the insulator 222 is trapped by the electron trap states in this manner, the threshold voltage is shifted in the positive direction. By controlling the voltage of the conductor 205, the amount of electrons to be trapped can be controlled, and thus the threshold voltage can be controlled. With this structure, the transistor 200 is a normally-off transistor, which is in a non-conduction state (also referred to as an off state) even when the gate voltage is 0V.

Furthermore, the treatment for trapping the electrons may be performed in the manufacturing process of the transistor. For example, the treatment is preferably performed at any step before factory shipment such as after the formation of the conductor connected to the source conductor or the drain conductor of the transistor, after the preceding process (wafer processing) is completed, after a wafer-dicing step, or after packaging.

A material having a barrier property against oxygen and hydrogen is preferably used for the insulator 222. When such a material is used, release of oxygen from the oxide 230 or entry of an impurity such as hydrogen from the outside can be prevented.

An oxide 230a, an oxide 230b, and an oxide 230c are formed using a metal oxide such as an In-M-Zn oxide (M is Al, Ga, Y, or Sn). Alternatively, an In—Ga oxide or an In—Zn oxide may be used as the oxide 230.

The oxide 230 according to the present invention will be described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in the oxide according to the present invention are described with reference to FIGS. 15A to 15C. Note that the proportion of oxygen atoms is not shown in FIGS. 15A to 15C. The terms of the atomic ratio of indium, the element M, and zinc contained in the oxide are denoted by [In], [M], and [Zn], respectively.

Figure 15A:
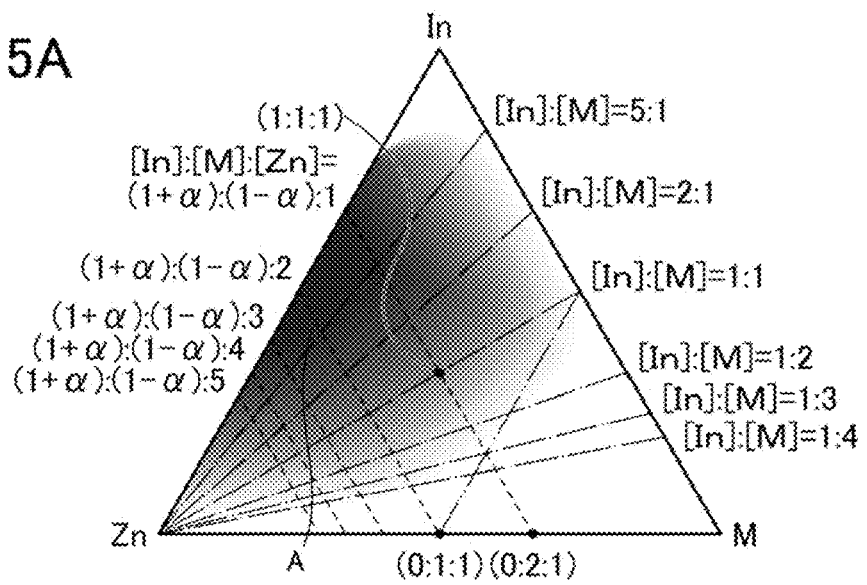
FIGS. 15A to 15C each illustrate an atomic ratio range of an oxide semiconductor according to one embodiment of the present invention.
Figure 15B:
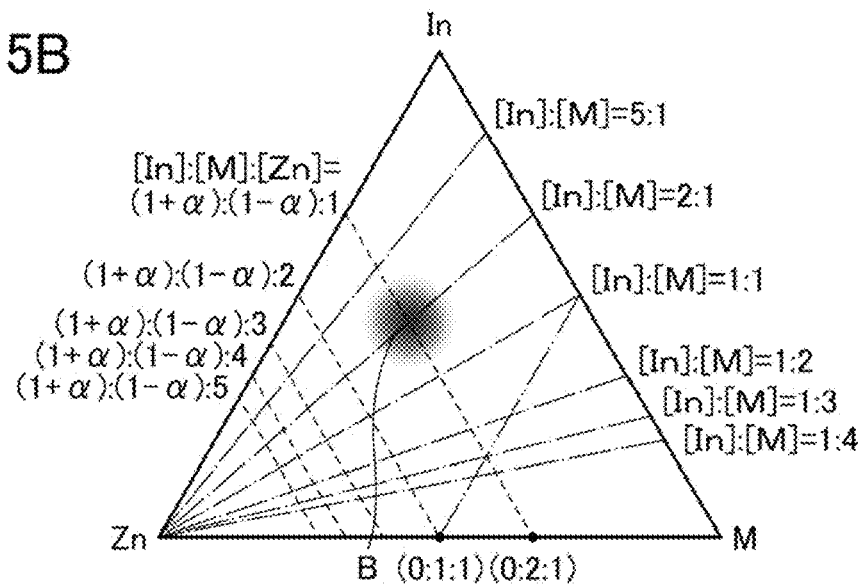
Figure 15C:
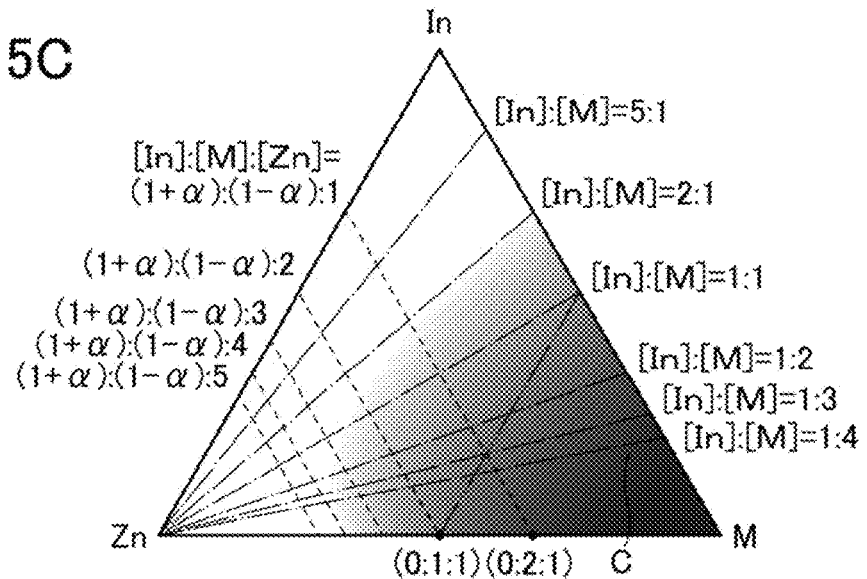

In FIGS. 15A to 15C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is 1:1:p, where $\beta \geq 0$, a line where the atomic ratio [In]:[M]:[Zn] is 1:2:p, a line where the atomic ratio [In]:[M]:[Zn] is 1:3:p, a line where the atomic ratio [In]:[M]:[Zn] is 1:4:p, a line where the atomic ratio [In]:[M]:[Zn] is 2:1:p, and a line where the atomic ratio [In]:[M]:[Zn] is 5:1:p.

Dashed-double dotted lines indicate a line where the atomic ratio [In]:[M]:[Zn] is $(1+\gamma):2:(1-\gamma)$, where $-1 \leq \gamma \leq 1$. An oxide with an atomic ratio [In]:[M]:[Zn] that is equal to or close to 0:2:1 in FIGS. 15A to 15C is likely to have a spinel crystal structure.

FIGS. 15A and 15B show examples of the preferred ranges of the atomic ratio of indium, the element M, and zinc contained in the oxide of one embodiment of the present invention.

Figure 16:
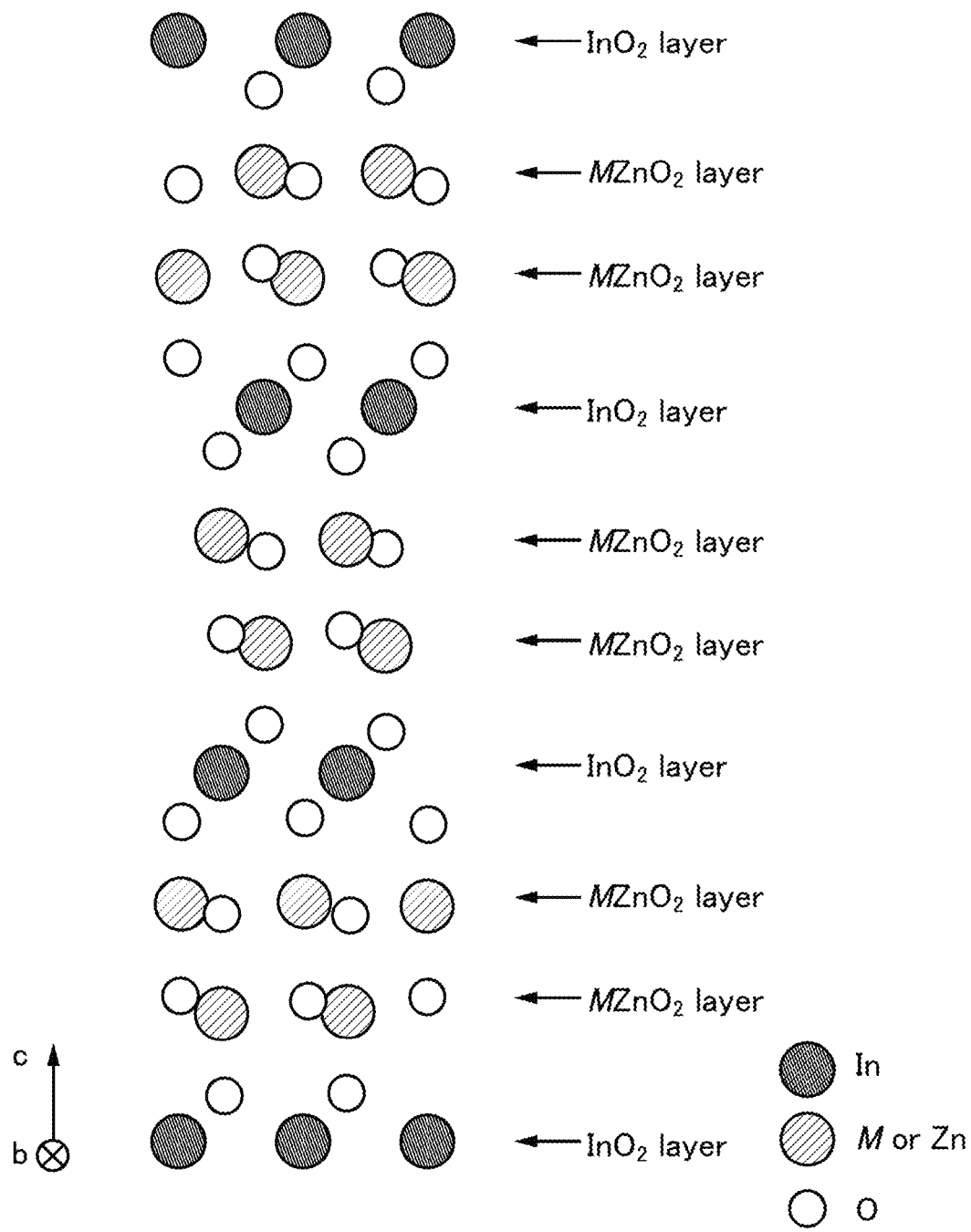
FIG. 16 illustrates an InMZnO4 crystal.

FIG. 16 illustrates an example of the crystal structure of $InMZnO_4$ whose atomic ratio of [In]:[M]:[Zn]=1:1:1. Furthermore, FIG. 16 illustrates the crystal structure of $InMZnO_4$ observed from a direction parallel to the b-axis. Note that a metal element of an $MZnO_2$ layer in FIG. 16 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes two $MZnO_2$ layers containing the element M and zinc for every $InO_2$ layer containing indium and, as shown in FIG. 16.

$InMZnO_4$ has a layered crystal structure (also referred to as a layered structure) and includes one layer which contains indium and oxygen (hereinafter referred to as an In layer) for every two (M,Zn) layers, which contain the element M, zinc, and oxygen.

Indium and the element M can be replaced with each other. Therefore, when the element M in the (M,Zn) layer is replaced with indium, the layer can also be referred to as an (In,M,Zn) layer. In that case, a layered structure that includes one In layer for every two (In,M,Zn) layers is obtained.

An oxide with an atomic ratio of [In]:[M]:[Zn]=1:1:2 has a layered structure that includes one In layer for every three (M,Zn) layers. In other words, if [Zn] is larger than [In] and [M], the proportion of (M,Zn) layers to In layers becomes higher when the oxide is crystallized.

Note that in the case where the number of (M,Zn) layers with respect to one In layer is not an integer in the oxide, the oxide might have a plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 15C), insulation performance becomes better.

Accordingly, an oxide in one embodiment of the present invention preferably has an atomic ratio represented by a region A in FIG. 15A. With the atomic ratio, a layered structure with high carrier mobility and a few grain boundaries is easily obtained.

A region B in FIG. 15B represents an atomic ratio of [In]:[M]:[Zn]=4:2:3 to 4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that the condition where an oxide has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor will be described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

To obtain stable electrical characteristics of the transistor, it is effective to reduce the concentration of impurities in the oxide. In addition, to reduce the concentration of impurities in the oxide, the concentration of impurities in a film that is adjacent to the oxide is preferably reduced. Examples of the impurities include hydrogen, nitrogen, alkali metal, alkaline earth metal, iron, nickel, silicon, and the like.

Here, the influence of impurities in the oxide is described.

When silicon or carbon that is a Group 14 element is contained in the oxide, defect states are formed. Thus, the concentration of silicon or carbon in the oxide and around an interface with the oxide (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal in the oxide measured by SIMS is set lower than or equal to $1\times10^{18}$ atoms/cm$^3$, and preferably lower than or equal to $2\times10^{16}$ atoms/cm$^3$.

When the oxide contains nitrogen, the oxide easily becomes n-type by generation of electrons serving as carriers and an increase of carrier density. Thus, a transistor whose oxide includes nitrogen is likely to be normally-on. For this reason, nitrogen in the oxide is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration measured by SIMS should be lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. A band diagram of insulators that are in contact with a layered structure of an oxide S1, an oxide S2, and an oxide S3 and a band diagram of insulators that are in contact with a layered structure of the oxide S1 and the oxide S2 and a layered structure of the oxide S2 and the oxide S3 are described with reference to FIGS. 17A to 17C.

Figure 17A:
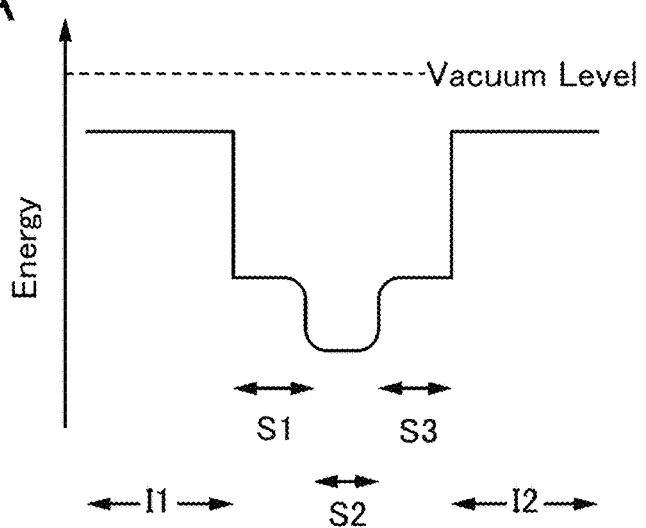
FIGS. 17A to 17C are each a band diagram of a stacked-layer structure of an oxide semiconductor.
Figure 17B:
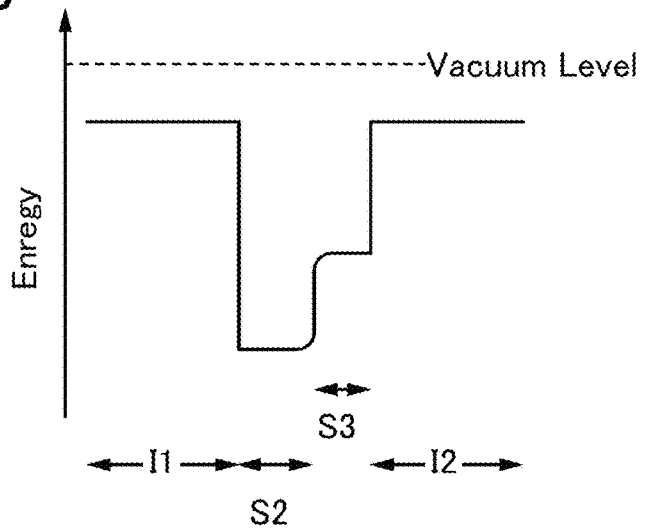
Figure 17C:
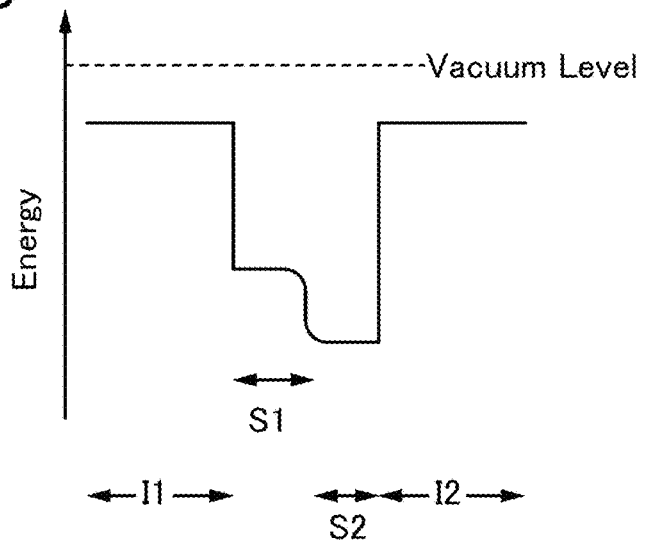

FIG. 17A is an example of a band diagram of a layered structure including an insulator I1, the oxide S1, the oxide S2, the oxide S3, and an insulator I2 in a thickness direction. FIG. 17B is an example of a band diagram of a layered structure including the insulator I1, the oxide S2, the oxide S3, and the insulator I2 in a thickness direction. FIG. 17C is an example of a band diagram of a layered structure including the insulator I1, the oxide S1, the oxide S2, and the insulator I2 in a thickness direction. Note that the band diagrams show the conduction band minimum (Ec) of each of the insulator I1, the oxide S1, the oxide S2, the oxide S3, and the insulator I2 for easy understanding.

The conduction band minimum of each of the oxides S1 and S3 is closer to the vacuum level than that of the oxide S2. Typically, a difference between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 17A to 17C, the conduction band minimum of each of the oxides S1 to S3 is gradually varied. In other words, the conduction band minimum is continuously varied or continuously connected. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 15C may be used as the oxides S1 and S3. Note that the region C in FIG. 15C represents the atomic ratio of [In]:[M]:[Zn]=0:1:0 or the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

One of the conductor 240a and the conductor 240b functions as a source electrode and the other functions as a drain electrode.

Each of the conductor 240a and the conductor 240b is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, the following structures can be given: a single-layer structure of an aluminum film containing silicon, a two-layer structure in which an tantalum film or a tantalum nitride film is stacked, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As the insulator 250, an insulator containing a high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used, for example. The insulating film may have a single-layer structure or a stacked-layer structure. Alternatively, for example, aluminum oxide, bismuth oxide, germanium oxide, niobium oxide, silicon oxide, titanium oxide, tungsten oxide, yttrium oxide, or zirconium oxide may be added to the insulator. Alternatively, the insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used.

Note that the insulator 250 may have the same stacked-structure of the insulator 220, the insulator 222, and the insulator 224. When the insulator 250 includes an insulator in which a necessary amount of electrons is trapped by the electron trap states in this manner, the transistor 200 can shift the threshold voltage in the positive direction. With this structure, the transistor 200 is a normally-off transistor, which is in a non-conduction state (also referred to as an off state) even when the gate voltage is 0 V.

The conductor 260 serving as the gate electrode can be formed using, for example, a metal selected from aluminum, chromium, copper, tantalum, titanium, molybdenum, and tungsten; an alloy containing any of these metals as a component; an alloy containing any of these metals in combination; or the like. Furthermore, one or both of manganese and zirconium may be used. Alternatively, a semiconductor typified by polycrystalline silicon doped with an impurity element such as phosphorus, or a silicide such as nickel silicide may be used. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

An oxide material from which oxygen is partly released due to heating is preferably used for the insulator 280.

As the oxide material from which oxygen is released due to heating, oxide containing oxygen in excess of the stoichiometric composition is preferably used. Part of oxygen is released by heating from an oxide film containing oxygen more than that in the stoichiometric composition. The oxide film containing oxygen in excess of the stoichiometric composition is an oxide film of which the amount of released oxygen converted into oxygen atoms is greater than or equal to $1.0\times10^{18}$ atoms/cm$^3$, and preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers an uneven surface below.

The insulator 270 may be provided to cover the conductor 260. When an oxide material from which oxygen is released is used as the insulator 280, a material having a barrier property against oxygen is used as the insulator 270 to prevent the conductor 260 from being oxidized by released oxygen. With this structure, the oxidation of the conductor 260 can be inhibited and oxygen released from the insulator 280 can be efficiently supplied to the oxide 230.

An insulator 282 and an insulator 284 are stacked in this order over the insulator 280. A conductor 244, a conductor 246a, a conductor 246b, and the like are embedded in the insulator 280, the insulator 282, and the insulator 284. Note that the conductor 244 functions as a plug or a wiring that is electrically connected to the capacitor 100 or the transistor 300. The conductor 246a and the conductor 246b function as a plug or a wiring that is electrically connected to the capacitor 100 or the transistor 200.

A material having a barrier property against oxygen and hydrogen is preferably used for one or both of the insulator 282 and the insulator 284. With this structure, oxygen released from the interlayer film in the vicinity of the transistor 200 can be efficiently diffused into the transistor 200.

The capacitor 100 is provided over the insulator 284. The capacitor described in the above embodiment can be used as the capacitor 100.

The conductor 104 and the conductor 124 are provided over the insulator 102. Note that the conductor 124 functions as a plug or a wiring electrically connected to the transistor 200 or the transistor 300.

The insulator 112 is provided over the conductor 104 and the conductor 116 is provided over the insulator 112. Furthermore, the conductor 116 covers the side surfaces of the conductor 104 with the insulator 112 provided therebetween. That is, the capacitor per projected area of the capacitor can be increased because the conductor 116 functions as the capacitor on the side surfaces of the conductor 104. Thus, the semiconductor device can be reduced in area, highly integrated, and miniaturized.

Figure 7B:
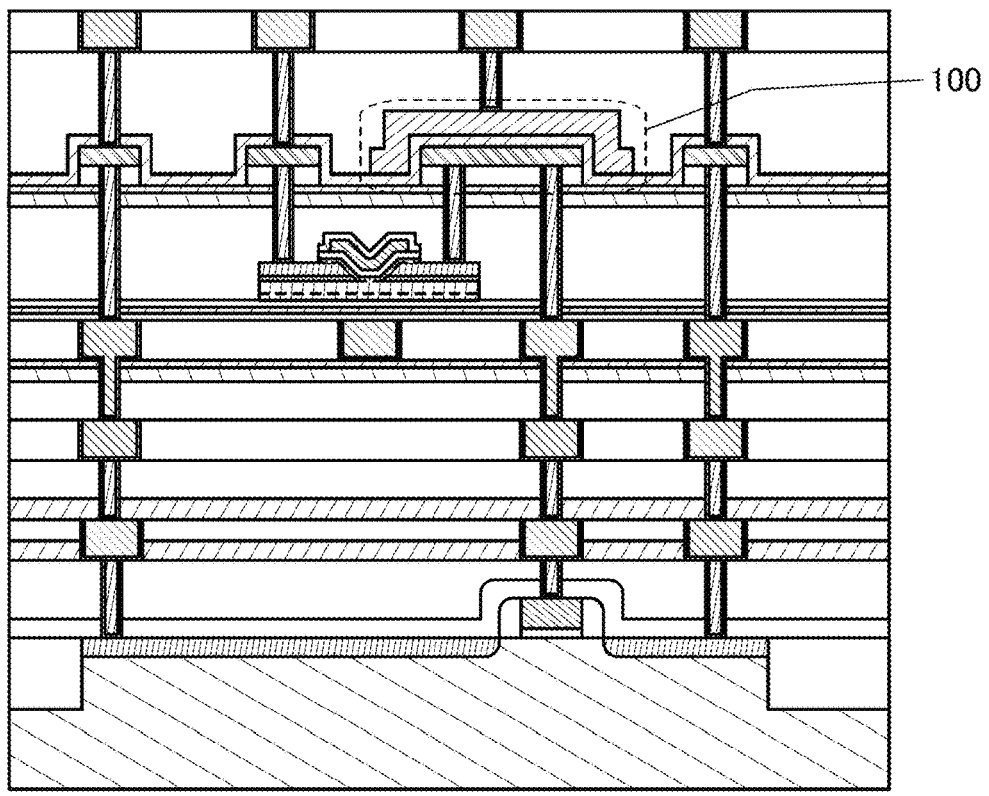

Note that the insulator 102 may be provided at least in a region overlapping with the conductor 104. For example, the insulator 102 is provided in only a region overlapping with the conductor 104 and the conductor 124 to be in contact with the insulator 112 as shown in FIG. 7B.

An insulator 120 and an insulator 122 are stacked in this order over the conductor 116. A conductor 126 is embedded in the insulator 120, the insulator 122, and the insulator 102. Note that the conductor 126 functions as a plug or a wiring that is electrically connected to the transistor 200 or the transistor 300.

The insulator 120 covering the capacitor 100 may function as a planarization film that covers an uneven surface below.

The above is the description of the structure example.
[Example of Manufacturing Method]

An example of a method for manufacturing the semiconductor device described in the above structure example is described below with reference to FIGS. 8A to 8D, FIGS. 9A to 9C, FIGS. 10A to 10C, FIGS. 11A and 11B, FIGS. 12A and 12B, FIGS. 13A and 13B, and FIG. 14.

First, the substrate 301 is prepared. A semiconductor substrate is used as the substrate 301. For example, a single crystal silicon substrate (including a p-type semiconductor substrate or an n-type semiconductor substrate), a compound semiconductor substrate containing silicon carbide or gallium nitride, or the like can be used. An SOI substrate may alternatively be used as the substrate 301. The case where single crystal silicon is used for the substrate 301 is described below.

Next, an element isolation layer is formed in the semiconductor substrate 301. The element isolation layer may be formed by a local oxidation of silicon (LOCOS) method, a shallow trench isolation (STI) method, or others.

In the case where a p-channel transistor and an n-channel transistor are formed on the same substrate, an n-well or a p-well may be formed in part of the semiconductor substrate 301. For example, a p-well may be formed by adding an impurity element imparting p-type conductivity such as boron to an n-type semiconductor substrate 301, and an n-channel transistor and a p-channel transistor may be formed on the same substrate.

Then, an insulator to be an insulator 304 is formed over the substrate 301. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulator may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or others.

Then, a conductive film to be the conductor 306 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Alternatively, a stacked-layer structure of a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented. Note that a material used for the conductive film can be selected in accordance with the required characteristics of the transistor 300 because a threshold voltage of the transistor 300 can be adjusted by determining the work function of the conductor 306.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like and an unnecessary portion of the conductive film is removed. After that, the resist mask is removed, whereby the conductor 306 is formed.

Here, a method for processing a film is described. In the case of finely processing a film, a variety of fine processing techniques can be used. For example, a method may be used in which a resist mask formed by a lithography process or the like is subjected to slimming treatment. Alternatively, a dummy pattern is formed by a lithography process or the like, the dummy pattern is provided with a sidewall and then removed, and a film is etched using the remaining sidewall as a resist mask. To achieve a high aspect ratio, anisotropic dry etching is preferably used for etching of a film. Alternatively, a hard mask formed of an inorganic film or a metal film may be used.

As light used to form the resist mask, for example, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may also be performed by a liquid immersion exposure technique. As light for the exposure, extreme ultra-violet light (EUV) or X-rays may be used. Instead of the light for the exposure, an electron beam can be used. It is preferable to use extreme ultra-violet light (EUV), X-rays, or an electron beam because extremely fine processing can be performed. In the case of performing exposure by scanning of a beam such as an electron beam, a photomask is not needed.

Before a resist film that is processed into the resist mask is formed, an organic resin film having a function of improving adhesion between a film and the resist film may be formed. The organic resin film can be formed by, for example, a spin coating method to planarize a surface by covering a step thereunder and thus can reduce variation in thickness of the resist mask over the organic resin film. In the case of fine processing, in particular, a material serving as an anti-reflection film against light for the exposure is preferably used for the organic resin film. Examples of such an organic resin film serving as an anti-reflection film include a bottom anti-reflection coating (BARC) film. The organic resin film may be removed at the same time as the removal of the resist mask or after the removal of the resist mask.

After the conductor 306 is formed, a sidewall covering the side surface of the conductor 306 may be formed. The sidewall can be formed in such a manner that an insulator thicker than the conductor 306 is formed and subjected to anisotropic etching so that only a portion of the insulator on the side surface of the conductor 306 remains.

An insulator to be the insulator 304 is etched simultaneously with the formation of the sidewall, whereby the insulator 304 is formed under the conductor 306 and the sidewall. The insulator 304 may be formed as follows: after the conductor 306 is formed, the insulator is etched using the conductor 306 or a resist mask for processing the conductor 306 as an etching mask. In that case, the insulator 304 is formed under the conductor 306. Alternatively, the insulator can be used as the insulator 304 without being processed by etching.

Next, an element which imparts n-type conductivity such as phosphorus or an element which imparts p-type conductivity such as boron is added to a region of the substrate 301 where the conductor 306 (and the sidewall) is not provided.

Next, the insulator 320 is formed, and then, heat treatment is performed to activate the aforementioned element that imparts conductivity.

The insulator 320 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulator 320 is preferably formed using silicon nitride containing oxygen and hydrogen (SiNOH) because the amount of hydrogen released by heating can be increased. Alternatively, the insulator 320 can also be formed using silicon oxide with high step coverage that is formed by reacting tetraethyl orthosilicate (TEOS), silane, or the like with oxygen, nitrous oxide, or the like.

The insulator 320 can be formed by, for example, a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method to reduce plasma damage.

The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 300 is formed.

Figure 8A:
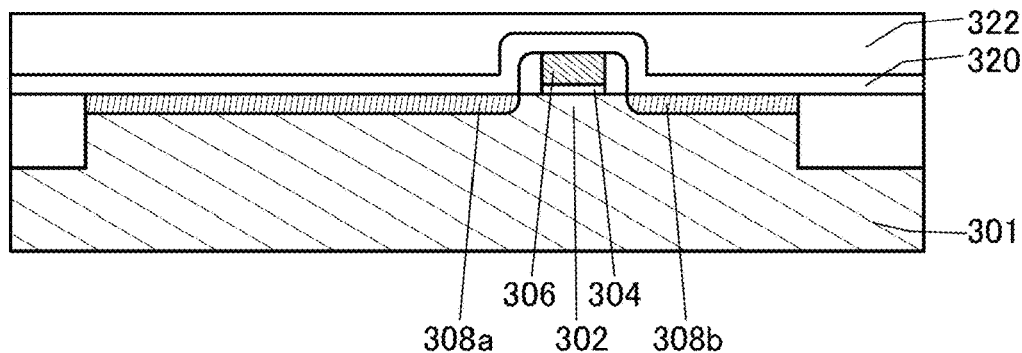
FIGS. 8A to 8D illustrate an example of a method for manufacturing a semiconductor device according to one embodiment.

Next, an insulator 322 is formed over the insulator 320. The insulator 322 can be formed using a material and a method similar to those of the insulator 320. In addition, the top surface of the insulator 322 is planarized by a CMP method or the like (FIG. 8A).

Figure 8B:
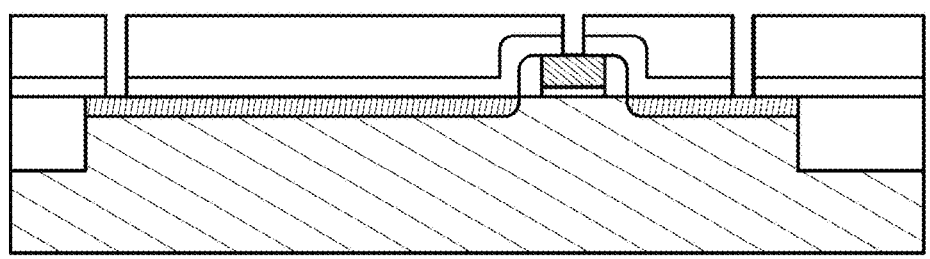
Figure 8C:
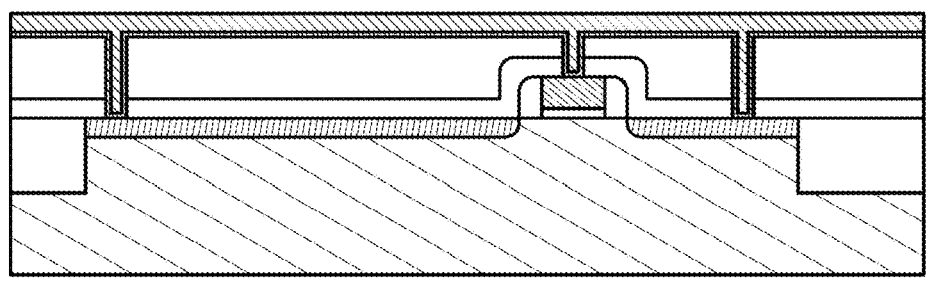

Next, an opening reaching the low-resistance region 308a, the low-resistance region 308b, the conductor 306, and the like are formed in the insulator 320 and the insulator 322 (FIG. 8B). After that, a conductive film is formed to fill the opening (FIG. 8C). The conductive film can be formed by a sputtering method, a CVD method (including a thermal CVD method, an MOCVD method, a PECVD method, and the like), an MBE method, an ALD method, a PLD method, or others.

Figure 8D:
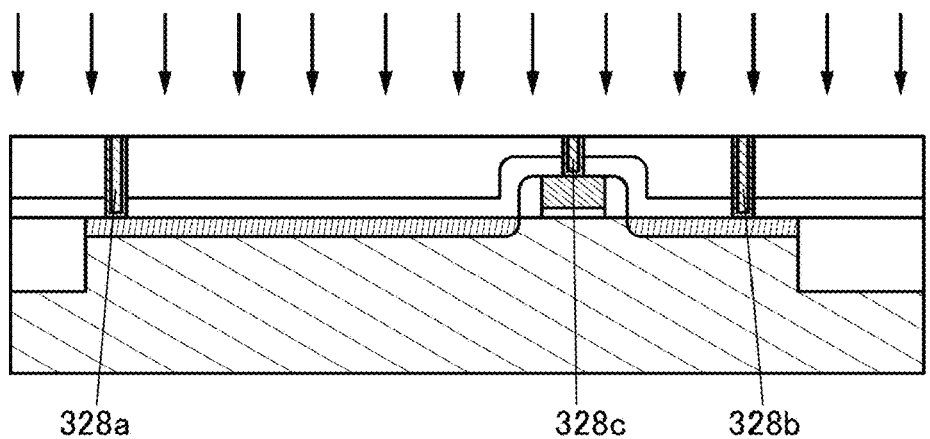

After that, the conductive film is subjected to planarization treatment to expose the top surface of the insulator 322, whereby a conductor 328a, a conductor 328b, a conductor 328c, and the like are formed (FIG. 8D). Note that arrows in the drawings indicate a CMP treatment. Furthermore, in the specification and the drawings, the conductor 328a, the conductor 328b, and the conductor 328c function as a plug or a wiring, which are simply referred to as the conductor 328 in some cases. Note that in the specification, conductors each functioning as a plug or a wiring are regarded in a similar manner.

Figure 9A:
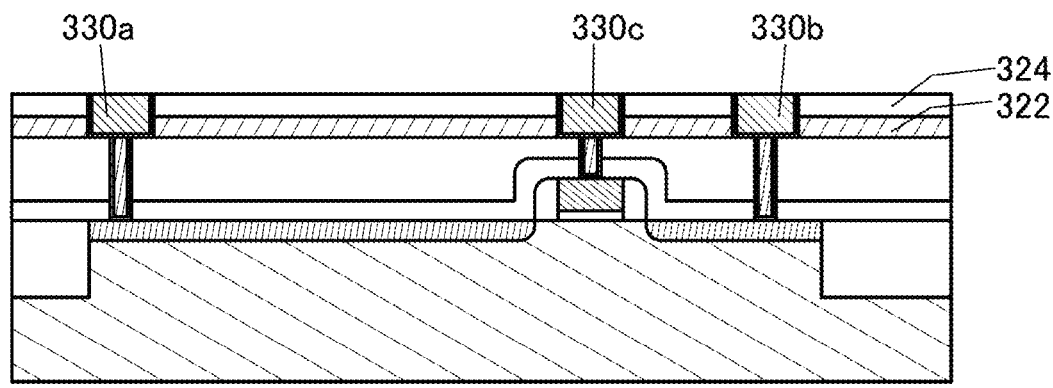
FIGS. 9A to 9C illustrate an example of a method for manufacturing a semiconductor device according to one embodiment.

After the insulator 322 and the insulator 324 are formed over the insulator 320, a conductor 330a, a conductor 330b, and a conductor 330c are formed by a damascene method or the like (FIG. 9A). The insulator 322 and the insulator 324 can be formed using a material and a method similar to those of the insulator 320. In addition, a conductive film to be the conductor 330 can be formed using a material and a method similar to those of the conductor 328.

Figure 9B:
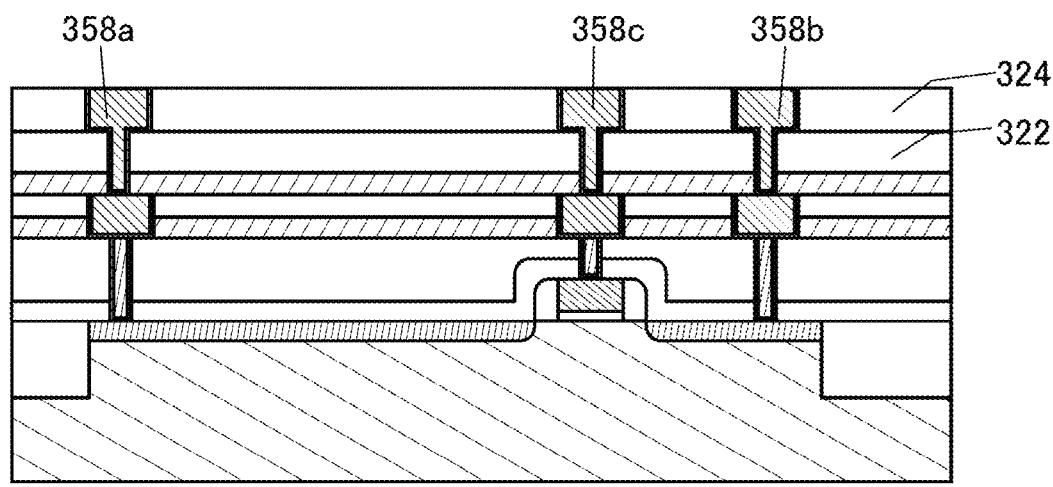

After an insulator 352 and an insulator 354 are formed, a conductor 358a, a conductor 358b, and a conductor 358c are formed in the insulator 352 and the insulator 354 by a dual damascene method or the like (FIG. 9B). The insulator 352 and the insulator 354 can be formed using a material and a method similar to those of the insulator 320. Furthermore, a conductive film to be the conductor 358 can be formed using a material and a method similar to those of the conductor 328.

Next, the transistor 200 is formed. After the insulator 210 is formed, the insulator 212 and the insulator 214 that have a barrier property against hydrogen or oxygen are formed. The insulator 210 can be formed using a material and a method similar to those of the insulator 320.

The insulator 212 and the insulator 214 can be deposited by a sputtering method, a CVD method (including a thermal CVD method, an MOCVD method, a PECVD method, and the like), an MBE method, an ALD method, a PLD method, or the like, for example. In particular, by an ALD method, any one of the insulators can be a dense insulator having reduced defects such as cracks or pinholes or having a uniform thickness.

Figure 9C:
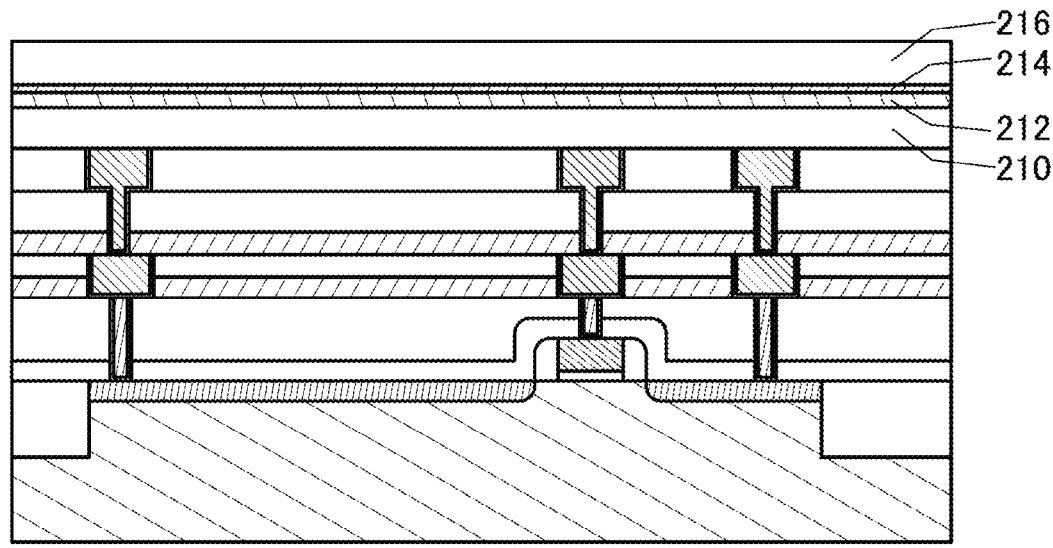

The insulator 216 is formed over the insulator 214. The insulator 216 can be formed using a material and a method similar to those of the insulator 210 (FIG. 9C)

Figure 10A:
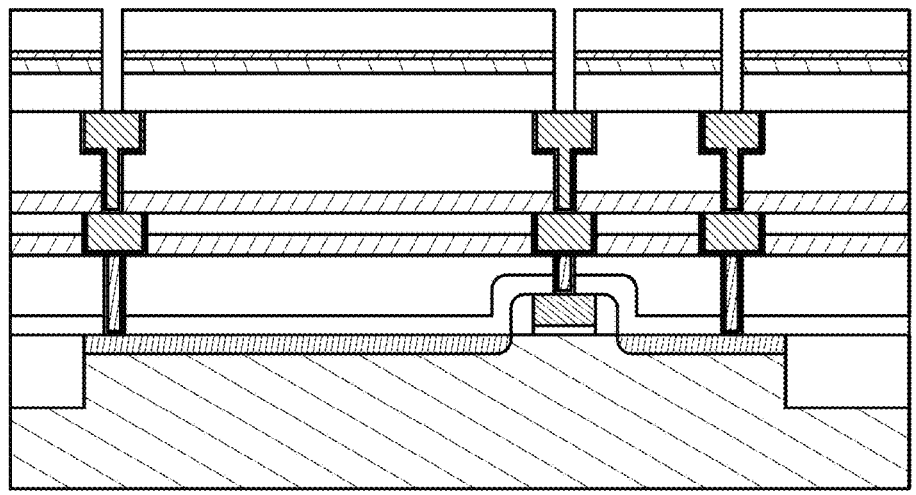
FIGS. 10A to 10C illustrate an example of a method for manufacturing a semiconductor device according to one embodiment.

After that, an opening reaching the conductor 358a, the conductor 358b, the conductor 358c, and the like are formed in the insulator 210, the insulator 212, the insulator 214, and the insulator 216 (FIG. 10A).

Figure 10B:
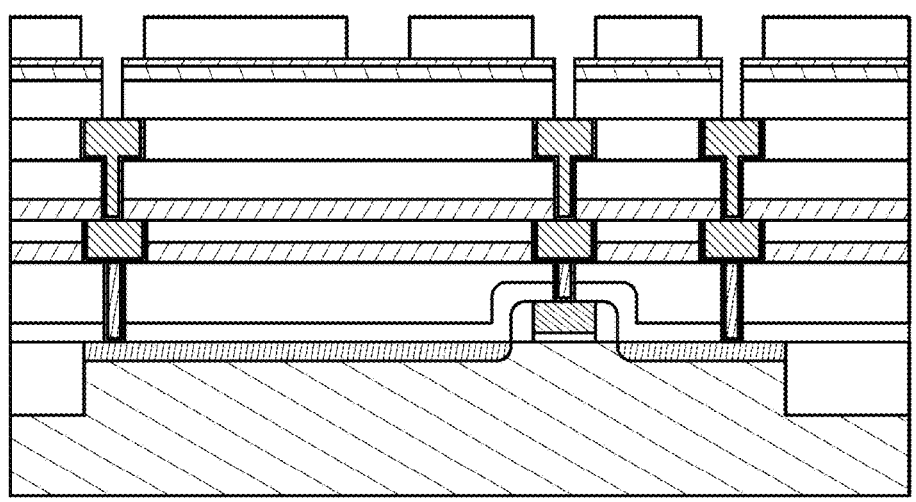

Next, an opening is formed in the insulator 216. The opening formed in the insulator 216 may be widened (FIG. 10B). When the opening formed in the insulator 216 is widened, the process margin can be obtained enough to process a plug or a wiring in a later step.

Figure 10C:
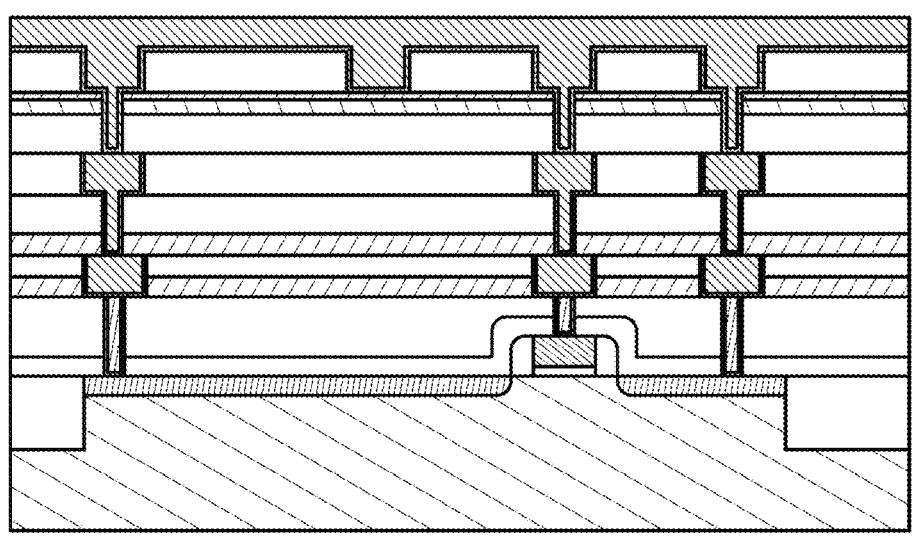
Figure 11A:
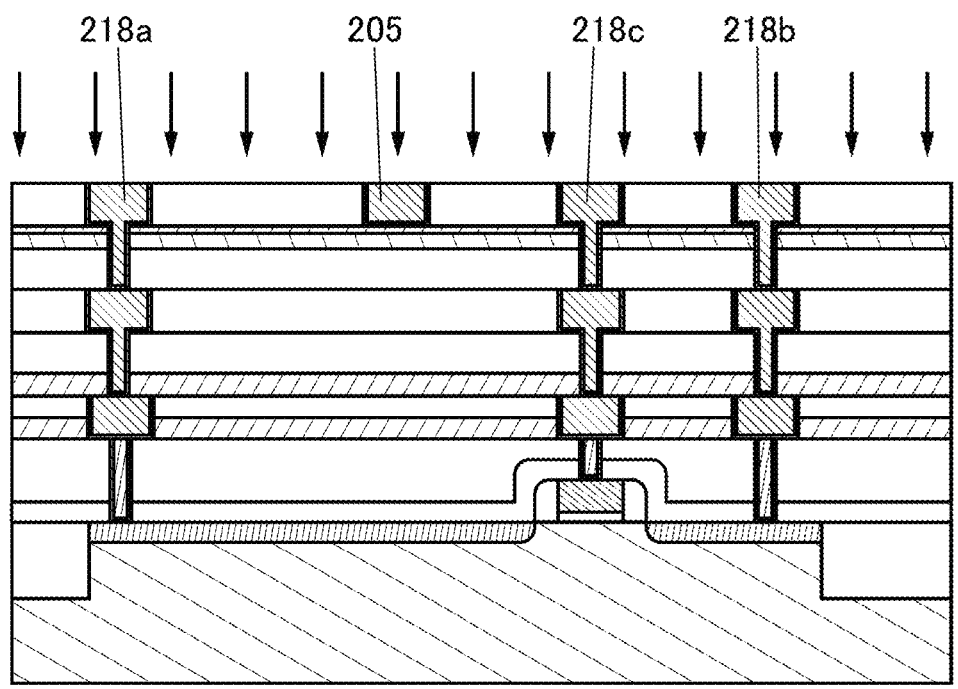
FIGS. 11A and 11B illustrate an example of a method for manufacturing a semiconductor device according to one embodiment.
Figure 11B:
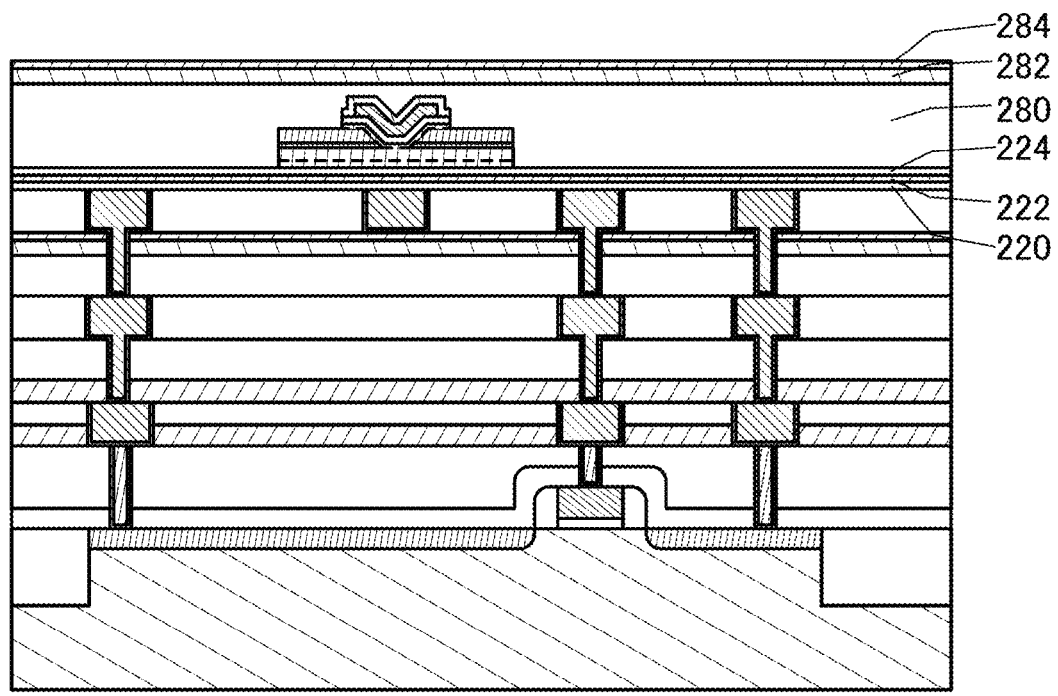

After that, a conductive film is formed to fill the opening (FIG. 10C). A conductive film can be formed using a material and a method similar to those of the conductor 328. After that, the conductive film is subjected to planarization treatment to expose the top surface of the insulator 216, whereby the conductor 218a, the conductor 218b, the conductor 218c, and the conductor 205 are formed (FIG. 11A). Note that arrows in the drawings indicate a CMP treatment.

Next, the insulator 220, the insulator 222, and the insulator 224 are formed. The insulator 220, the insulator 222, and the insulator 224 can be formed using a material and a method similar to those of the insulator 210. In particular, a high-k material is preferably used as the insulator 222.

An oxide to be the oxide 230a and an oxide to be the 230b are formed in this order. The oxides are preferably formed successively without contact with the air.

After the oxide to be the oxide 230b is formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate released oxygen. The heat treatment may be performed directly after the formation of the oxide to be the oxide 230b or may be performed after the oxide to be the oxide 230b is processed into the island-shaped oxide 230b. Through the heat treatment, oxygen is supplied with the oxide 230a and the oxide 230b from the insulator formed under the oxide 230a, whereby oxygen vacancy in the oxides can be reduced.

After that, a conductive film to be the conductor 240a and a conductive film to be the conductor 240b are formed over the oxide to be the oxide 230b. Next, a resist mask is formed by a method similar to that described above, and unnecessary portions of the conductive film are removed by etching. After that, unnecessary portions of the oxides are removed by etching using the conductive film as a mask. Then, the resist mask is removed. In this manner, a stacked-layer structure including the island-shaped oxide 230a, the island-shaped oxide 230b, and an island-shaped conductor can be formed.

Next, a resist mask is formed over an island-shaped conductive film by a method similar to that described above, and an unnecessary portion of the conductive film is removed by etching. Then, the resist mask is removed, so that the conductor 240a and the conductor 240b are formed.

An oxide to be the oxide 230c, an insulator to be the insulator 250, a conductive film to be the conductor 260 are formed in this order. Next, a resist mask is formed over the conductive film by a method similar to that described above, and unnecessary portions of the conductive film are removed by etching, whereby the conductor 260 is formed.

An insulator to be the insulator 270 is formed over an insulator to be the insulator 250 and the conductor 260. A material having a barrier property against hydrogen and oxygen is preferably used as the insulator to be the insulator 270. Next, a resist mask is formed over the insulator by a method similar to the above, and unnecessary portions each of the insulator to be the insulator 270, the insulator to be the insulator 250, and the oxide to be the oxide 230c are removed by etching. Then, the resist mask is removed, so that the transistor 200 is formed.

Next, an insulator 280 is formed. The insulator 280 preferably contains oxide containing oxygen more than that in the stoichiometric composition. After an insulator to be the insulator 280 is formed, the insulator to be the insulator 280 may be subjected to planarization treatment using a CMP method or the like to improve the planarity of a top surface of the insulator to be the insulator 280.

To make the insulator 280 contain excess oxygen, the insulator 280 may be formed in an oxygen atmosphere, for example. Alternatively, a region excessively containing oxygen may be formed by introducing oxygen into the insulator 280 that has been formed. Both the methods may be combined.

For example, oxygen (at least including any of oxygen radicals, oxygen atoms, and oxygen ions) is introduced into the insulator 280 that has been formed, whereby a region containing excess oxygen is formed. Oxygen can be introduced by an ion implantation method, an ion doping method, a plasma immersion ion implantation method, plasma treatment, or the like.

A gas containing oxygen can be used as oxygen introducing treatment. As a gas containing oxygen, oxygen, dinitrogen monoxide, nitrogen dioxide, carbon dioxide, carbon monoxide, or the like can be used. A rare gas may be contained in the oxygen-containing gas in introducing oxygen. For example, a mixed gas of carbon dioxide, hydrogen, and argon can be used.

Furthermore, a method of stacking oxides over the insulator 280 using a sputtering apparatus is given. For example, an insulator 282 is formed in the following manner: the insulator 280 is formed in an oxygen gas atmosphere with the use of a sputtering apparatus, whereby oxygen can be introduced into the insulator 280 while forming the insulator 282.

Next, the insulator 284 is formed. The insulator 284 can be formed using a material and a method similar to those of the insulator 210. For the insulator 284, an oxide aluminum having a barrier property against oxygen and hydrogen and the like are preferably used. In particular, by an ALD method, the insulator 284 can be a dense insulator having reduced defects such as cracks or pinholes or having a uniform thickness.

The insulator 284 having dense film quality is stacked over the insulator 282, whereby the excess oxygen introduced to the insulator 280 can be efficiently sealed in the transistor 200.

Next, the capacitor 100 is formed. First, the insulator 102 is formed over the insulator 284. The insulator 102 can be formed using a material and a method similar to those of the insulator 210.

Next, an opening reaching the conductor 218a, the conductor 218b, the conductor 218c, the conductor 240a, the conductor 240b, and the like are formed in the insulator 220, the insulator 222, the insulator 224, the insulator 280, the insulator 282, and the insulator 284.

After that, a conductive film is formed to fill the opening and the conductive film is subjected to planarization treatment to expose the top surface of the insulator 216, whereby the conductor 244a, the conductor 244b, the conductor 244c, the conductor 246a, and the conductor 246b are formed. The conductive film can be formed using a material and a method similar to those of the conductor 328.

Figure 12A:
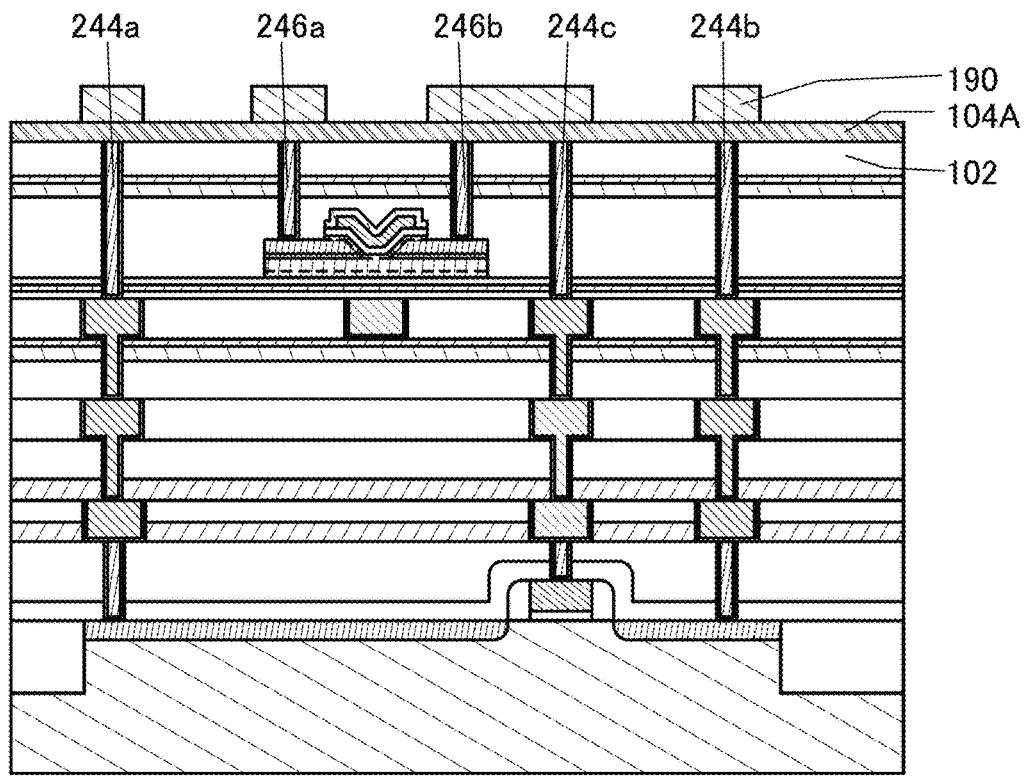
FIGS. 12A and 12B illustrate an example of a method for manufacturing a semiconductor device according to one embodiment.

Then, a conductive film 104A is formed over the insulator 102. The conductive film 104A can be formed using a material and a method similar to those of the conductor 328. Next, a resist mask 190 is formed over the conductive film 104A (FIG. 12A).

Figure 12B:
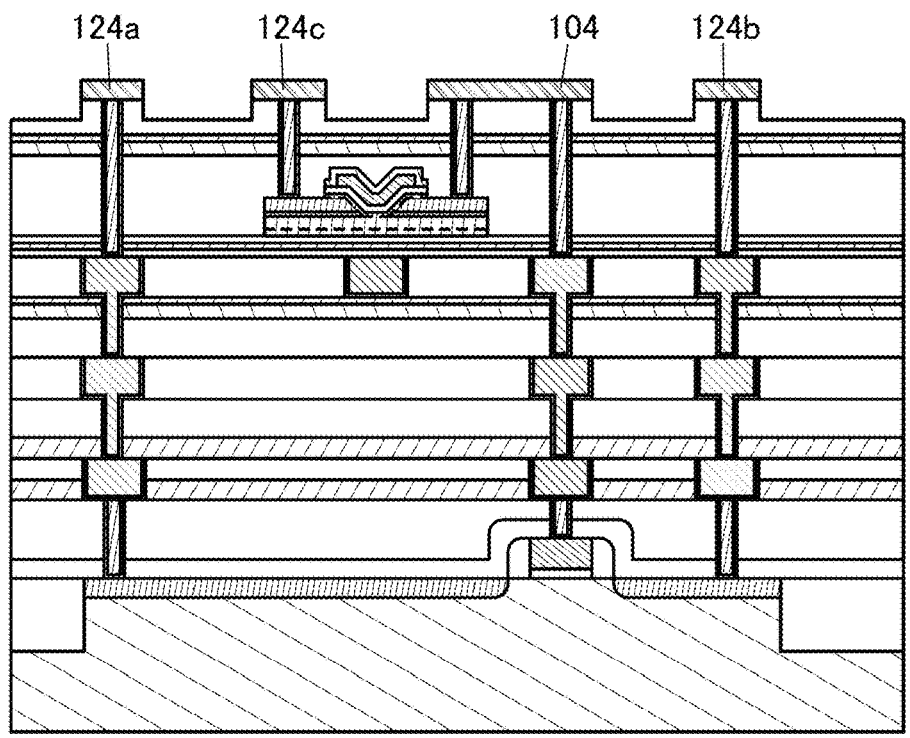

The conductor 124a, the conductor 124b, and the conductor 124c, and the conductor 104 are formed by etching the conductive film 104A. When the etching treatment is an over-etching treatment, part of the insulator 102 can be removed at the same time (FIG. 12B). The insulator 102 is removed by a thickness larger than a thickness of the insulator 112 that is formed later. That is, in the thickness direction, the top surface of the region of the insulator 102 to which the over-etching treatment is performed is located on the transistor 200 side compared with the top surface of the region overlapping with the conductor 104, and then, the over-etching treatment has an etching depth more than the thickness of the insulator 112. In addition, when the conductor 104 is formed by over-etching treatment, etching can be performed without leaving a residue.

Furthermore, part of the insulator 102 can be efficiently etched by changing the kind of etching gas in the etching treatment.

For example, after the conductor 104 is formed, the resist mask 190 is removed and part of the insulator 102 may be removed with the use of the conductor 104 as a hard mask.

Furthermore, cleaning treatment is performed on the surface of the conductor 104 after the conductor 104 is formed. The cleaning treatment can remove an etching residue and the like.

In addition, the insulator 284 may be an etching stopper film when a film used for the insulator 102 is different from that used for the insulator 284. In that case, the insulator 102 is formed in a region overlapping with the conductor 124 and the conductor 104 as shown in FIG. 12B.

Figure 13A:
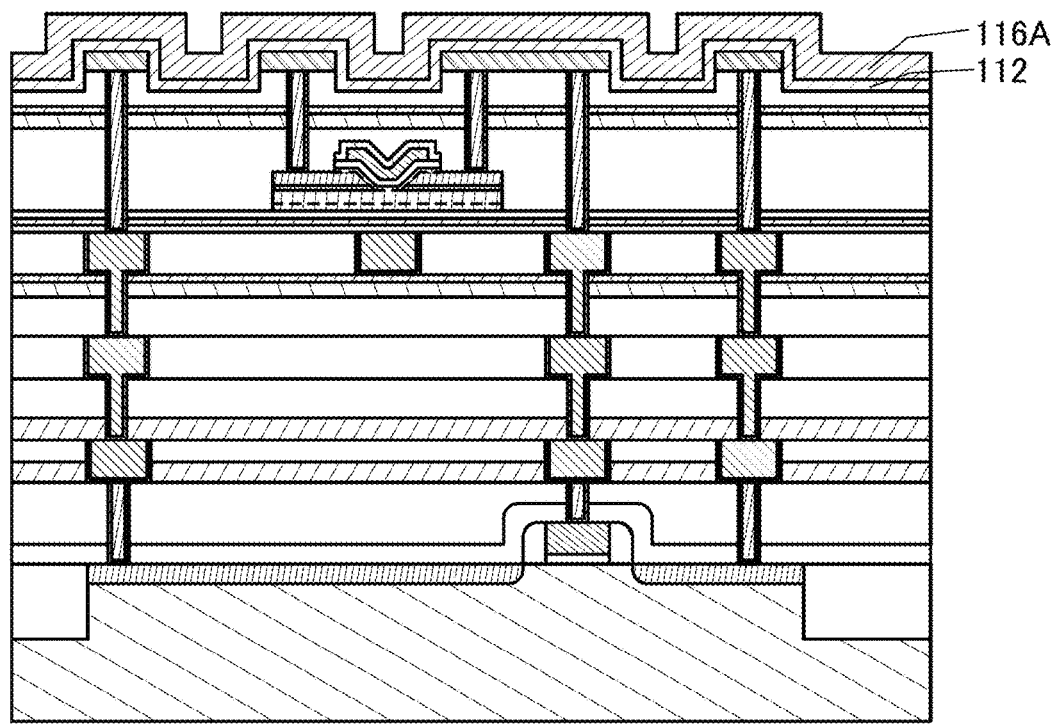
FIGS. 13A and 13B illustrate an example of a method for manufacturing a semiconductor device according to one embodiment.

The insulator 112 is formed covering the side surfaces and the top surface of the conductor 104 (FIG. 13A). The insulator 112 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium, nitride, or the like.

For example, a stacked-layer structure is preferably formed using a high-k material such as aluminum oxide and a material with high dielectric strength such as silicon oxynitride, for example. With this structure, the capacitor 100 can have sufficient capacitance by a high-k material and high dielectric strength is improved by a material with high dielectric strength, whereby electrostatic breakdown of the capacitor 100 can be inhibited and the reliability of the capacitor 100 can be improved.

The conductive film 116A is formed over the insulator 112 (FIG. 13A). Note that the conductive film 116A can be formed using a material and a method similar to those of the conductor 104. Next, a resist mask 190 is formed over the conductive film 116A, and an unnecessary portion of the conductive film 116A is removed by etching. Then, the resist mask is removed, so that the conductor 116 is formed.

The conductor 116 is provided to cover the side surfaces and the top surface of the conductor 104 with the insulator 112 provided therebetween. Note that as shown in FIG. 1C, it is preferable to provide the distance "d" between the top surface of the insulator 112 in a region where the insulator 102 is in contact with the insulator 112 and the bottom surface of the conductor 104 in a region where the insulator 112 is in contact with the conductor 104 is more than or equal to 0.

With this structure, the side surfaces of the conductor 104 are covered with the conductor 116 with the insulator 112 provided therebetween. Accordingly, in the capacitor 100, a capacitor having a large capacitance per projected area can be formed because the region surrounded by the dashed-dotted line (the sum of the area of the top surface and the side surfaces of the conductor 104) shown in FIG. 1B functions as a storage capacitor.

Figure 13B:
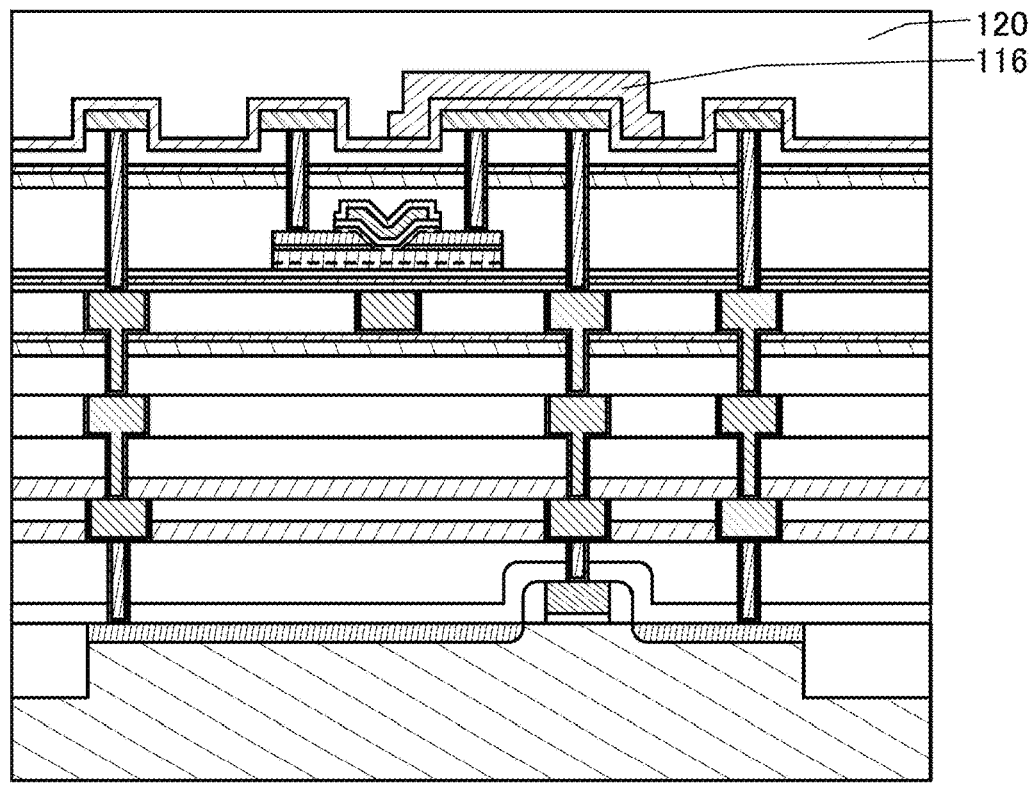

The insulator 120 covering the capacitor 100 is formed (FIG. 13B). An insulator to be the insulator 120 can be formed using a material and a method similar to those of the insulator 102 and the like.

Next, an opening reaching the conductor 124a, the conductor 124b, the conductor 124c, the conductor 104, and the like is formed in the insulator 120.

After that, a conductive film is formed to fill the opening and the conductive film is subjected to planarization treatment to expose the top surface of the insulator 120, whereby the conductor 126a, the conductor 126b, the conductor 126c, the conductor 126d are formed. The conductive film can be formed using a material and a method similar to those of the conductor 244.

Next, a conductive film to be the conductor 128 is formed. The conductive film can be formed by a sputtering method, a CVD method (including a thermal CVD method, an MOCVD method, a PECVD method, and the like), an MBE method, an ALD method, a PLD method, or others. In particular, it is preferable that the conductive film be formed by a CVD method, further preferably a plasma CVD method because coverage can be improved. It is preferable to use a thermal CVD method, an MOCVD method, or an ALD method in order to reduce plasma damage.

The conductive film to be the conductor 128 can be formed using, for example, a metal selected from aluminum, chromium, copper, tantalum, titanium, molybdenum, and tungsten; an alloy containing any of these metals as a component; an alloy containing any of these metals in combination; or the like. Furthermore, one or both of manganese and zirconium may be used. Alternatively, a semiconductor typified by polycrystalline silicon doped with an impurity element such as phosphorus, or a silicide such as nickel silicide may be used. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film that contains aluminum and one or more elements selected from titanium, tantalum, tungsten, molybdenum, chromium, neodymium, and scandium may be used.

Next, a resist mask is formed over a conductive film to be the conductor 128 by a method similar to that described above, and an unnecessary portion of the conductive film is removed by etching. Then, the resist mask is removed, so that the conductor 128a, the conductor 128b, the conductor 128c, and the conductor 128d are formed.

Figure 14:
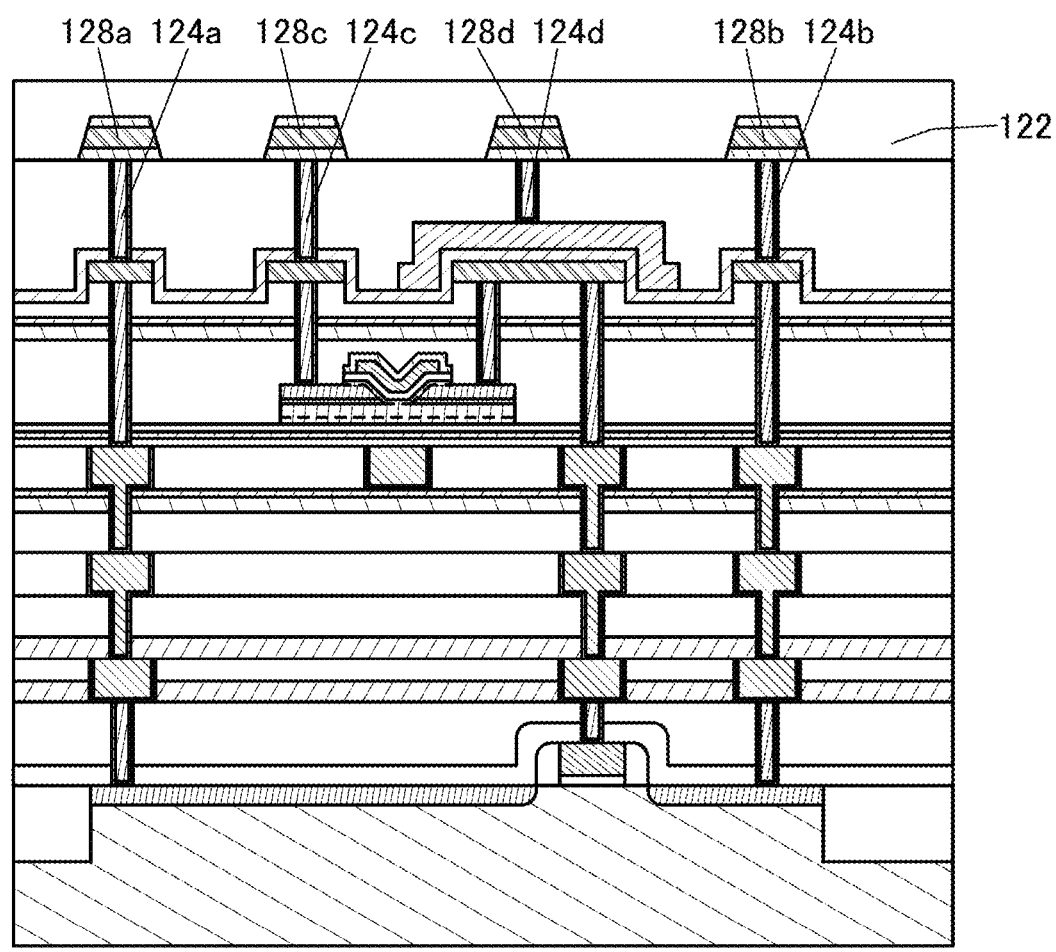
FIG. 14 illustrates an example of a method for manufacturing a semiconductor device according to one embodiment.

Next, the insulator 122 is formed over the insulator 120 (FIG. 14). An insulator to be the insulator 122 can be formed using a method and a material similar to those of the insulator 122 and the like.

Through the above steps, the semiconductor device in one embodiment of the present invention can be manufactured.

At least part of this embodiment can be implemented in combination with any of the other embodiments and the other examples described in this specification as appropriate.

Embodiment 3

In this embodiment, one embodiment of a semiconductor device is described with reference to FIGS. 18A to 18C, FIGS. 19A to 19C, FIGS. 20A to 20C, and FIGS. 21A to 21C.

<Transistor Structure 1>

Figure 18A:
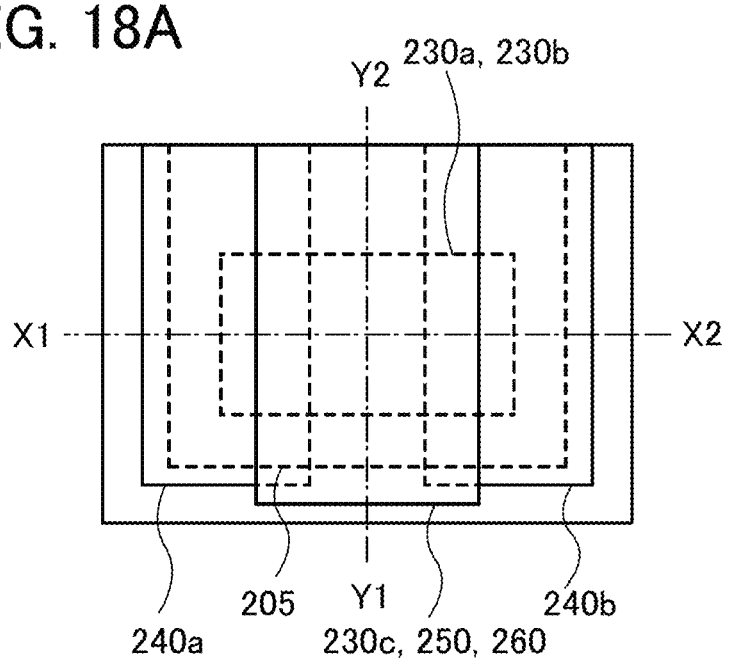
FIGS. 18A to 18C illustrate a top view structure and cross-sectional structures of a transistor according to one embodiment.
Figure 18B:
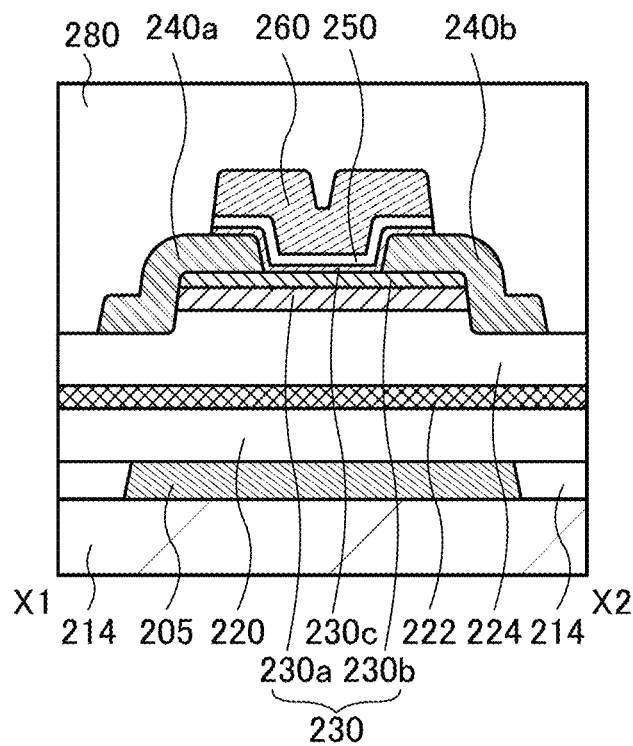
Figure 18C:
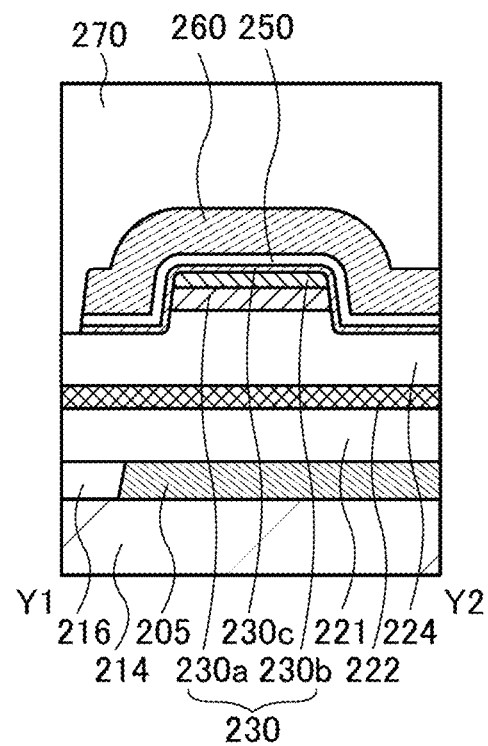

An example of a transistor according to one embodiment of the present invention is described below. FIGS. 18A to 18C are a top view and cross-sectional views illustrating a transistor according to one embodiment of the present invention. FIG. 18A is a top view. FIG. 18B is a cross-sectional view taken along dashed-dotted line X1-X2 in FIG. 18A. FIG. 18C is a cross-sectional view taken along dashed-dotted line Y1-Y2 in FIG. 18A. Note that for simplification of the drawing, some components in the top view in FIG. 18A are not illustrated.

Note that in the transistor 200 in each of FIGS. 18A to 18C, components having the same function as the components in the transistor 200 in FIGS. 6A to 6C are denoted by the same reference numerals.

The transistor 200 includes the conductor 205 and the conductor 260 that function as a gate insulating layer, the insulator 220, the insulator 222, and the insulator 224 and an insulator 250 that function as gate insulating layers, the oxide 230 having a region where a channel is formed, a conductor 240a that function as one of a source and a drain, a conductor 240b that function as the other of the source and the drain, and the insulator 280 containing excess oxygen.

In addition, the oxide 230 includes the oxide 230a, the oxide 230b over the oxide 230a, and the oxide 230c over the oxide 230b. When the transistor 200 is turned on, a current flows (a channel is formed) in the oxide 230b. Although current sometimes flow through a region in the vicinity of the interface (a mixed region in some cases) between the oxide 230b and the oxide 230a and the oxide 230c, the oxide 230a and the oxide 230c function as insulators at the other region.

As the insulator 216, a silicon oxide film, a silicon oxynitride film, or the like can be used. As the insulator 216, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has a barrier property against oxygen and hydrogen, can be used. The insulator formed of such a material functions as a layer that prevents entry of an impurity such as hydrogen from the substrate or other structures. The insulator 216 may have a stacked-layer structure.

The conductor 205 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, a stacked-layer structure of the above conductive material and the above metal material can be employed.

Each of the insulator 220 and the insulator 224 is preferably an insulator containing oxygen such as a silicon oxide film or a silicon oxynitride film. Note that as the insulator 224, an insulator containing excessive oxygen (containing oxygen in excess of that in the stoichiometric composition) is preferably used. When such an insulator containing excess oxygen is provided in contact with the oxide 230, oxygen vacancies in the oxide 230 can be compensated. Note that the insulator 220 and the insulator 224 are not necessarily formed of the same material.

The insulator 220 and the insulator 224 may each have a stacked-layer structure. For example, an insulating film containing excess oxygen is provided in contact with the oxide 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 230.

For the insulator 222, hafnium oxide, hafnium oxynitride, aluminum oxide, aluminum oxynitride, gallium oxide, gallium oxynitride, yttrium oxide, yttrium oxynitride, zirconium oxide, zirconium oxynitride, silicon nitride, tantalum oxide, titanium oxide, strontium titanium oxide (STO), barium strontium titanium oxide (BST), or the like can be used. Note that the insulator 222 may have a stacked-layer structure of two or more layers. In that case, the stacked-layer structure is not limited to being formed of the same materials and may be formed of different materials.

As any of the insulator 220, the insulator 224, or the insulator 222, a material having a barrier property against oxygen or hydrogen is preferably used. When such a material is used, release of oxygen from the oxide 230 or entry of an impurity such as hydrogen from the outside can be prevented.

When the insulator 220 and the insulator 224 are formed using silicon oxide and the insulator 222 is formed using hafnium oxide, the insulator 220 and the insulator 224 may be formed by a chemical vapor deposition method (including a CVD method and an atomic layer deposition (ALD) method) and the insulator 222 may be formed by a sputtering method. Note that using a sputtering method for the formation of the insulator 222 might easily crystallize the insulator 222 at low temperature to generate a large amount of fixed charges.

In addition to the insulator 250, a barrier film may be provided between the oxide 230 and the conductor 260 in the semiconductor device shown in FIGS. 18A to 18C. Alternatively, the oxide 230c may have a barrier property.

The conductor 260, the conductor 240a, and the conductor 240b can be formed using a material similar to that of the conductor 205. Examples of the material are a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); and the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, a stacked-layer structure of the above conductive material and the above metal material can be employed.

The insulator 250 is preferably an insulator containing oxygen such as a silicon oxide film or a silicon oxynitride film. Note that as the insulator 250, an insulator containing excessive oxygen (containing oxygen in excess of that in the stoichiometric composition) is preferably used. When such an insulator containing excess oxygen is provided in contact with the oxide 230, oxygen vacancies in the oxide 230 can be compensated.

The insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has a barrier property against oxygen and hydrogen, can be used. The insulator 250 formed of such a material functions as a layer which prevents release of oxygen from the oxide 230 and entry of an impurity such as hydrogen from the outside.

The insulator 250 may have a stacked-layer structure. For example, an insulating film containing excess oxygen is provided in contact with the oxide 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 230.

With the above structure, the shift of the threshold voltage in the positive direction can allow the transistor that includes the oxide semiconductor to be a normally-off transistor, which is in a non-conduction state (an off state) even when the gate voltage is 0 V.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided.

A highly reliable transistor can be provided.

<Transistor Structure 2>

Figure 19A:
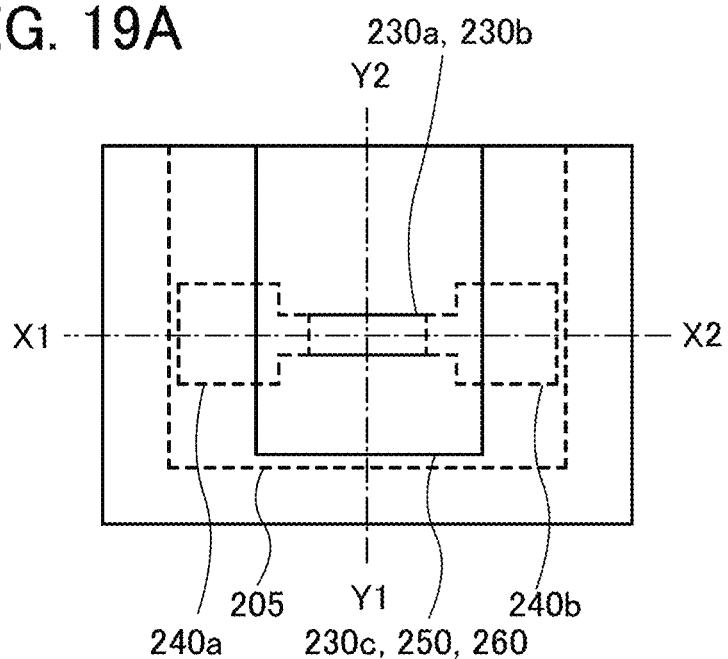
FIGS. 19A to 19C illustrate a top view structure and cross-sectional structures of a transistor according to one embodiment.
Figure 19B:
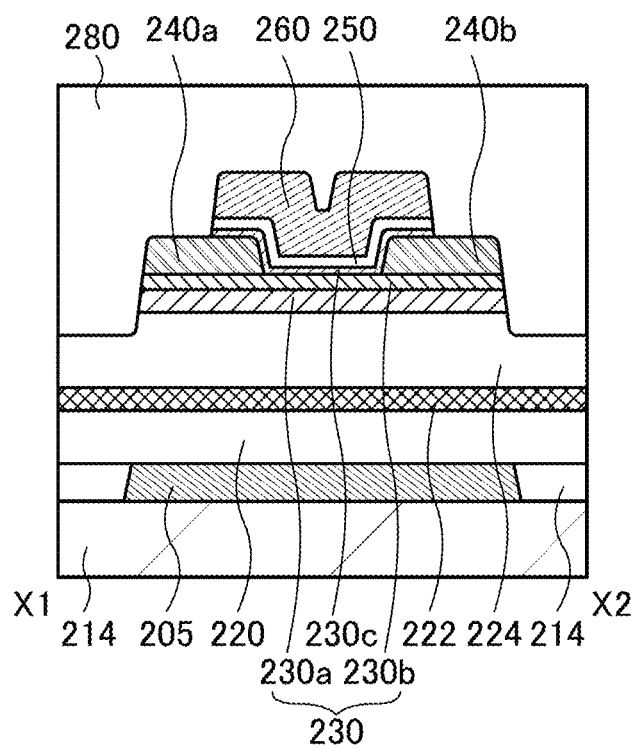
Figure 19C:
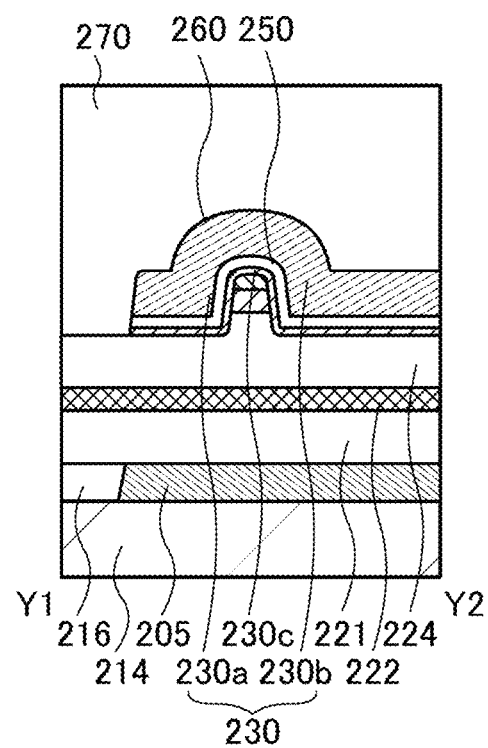

FIGS. 19A to 19C illustrate an example of a structure that can be applied to the transistor 200. FIG. 19A illustrates a top surface of the transistor 200. For simplification of the figure, some films are omitted in FIG. 19A. FIG. 19B is a cross-sectional view taken along the dashed-dotted line X1-X2 in FIG. 19A, and FIG. 19C is a cross-sectional view taken along the dashed-dotted line Y1-Y2 in FIG. 19A.

Note that in the transistor 200 in FIGS. 19A to 19C, components having the same function as the components in the transistor 200 in FIGS. 18A to 18C are denoted by the same reference numerals.

In the structure illustrated in FIGS. 19A to 19C, the edges of the conductor 240a and the conductor 240b on three sides are aligned with part of the edge of the oxide 230. Hence, the conductor 240a and the conductor 240b and the oxide 230 can be formed at the same time. Accordingly, the number of masks and the steps can be reduced. Furthermore, yield and productivity can be improved.

In the structure, a region of the oxide 230b where a channel is formed can be electrically surrounded by an electric field of the conductor 260 which functions as a gate electrode. A structure in which a semiconductor is electrically surrounded by an electric field of a gate electrode is referred to as a surrounded channel (s-channel) structure.

Thus, the channel might be formed in the entire oxide 230b which faces the conductor 260 with the insulator 250 provided therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

<Transistor Structure 3>

Figure 20A:
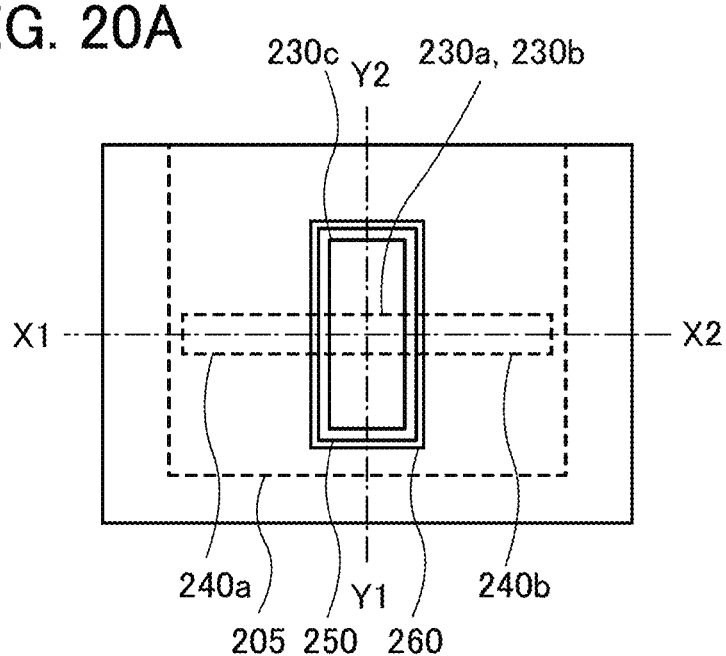
FIGS. 20A to 20C illustrate a top view structure and cross-sectional structures of a transistor according to one embodiment.
Figure 20B:
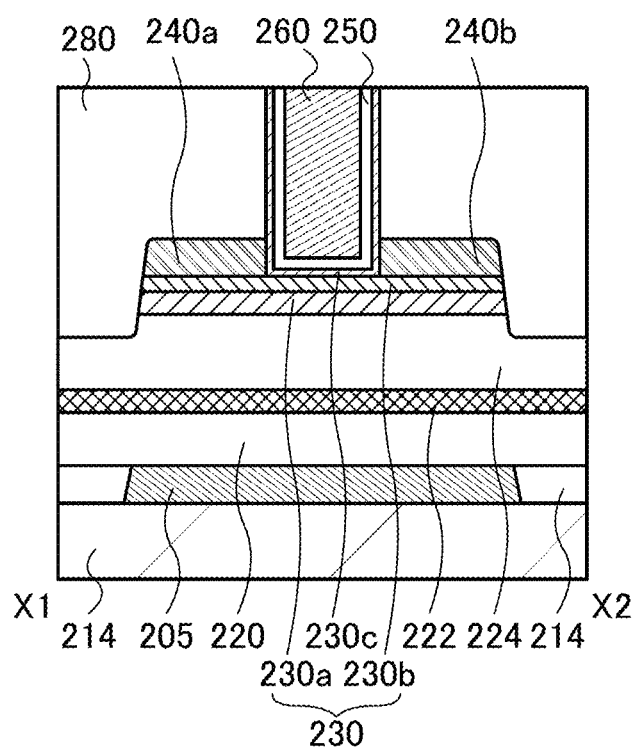
Figure 20C:
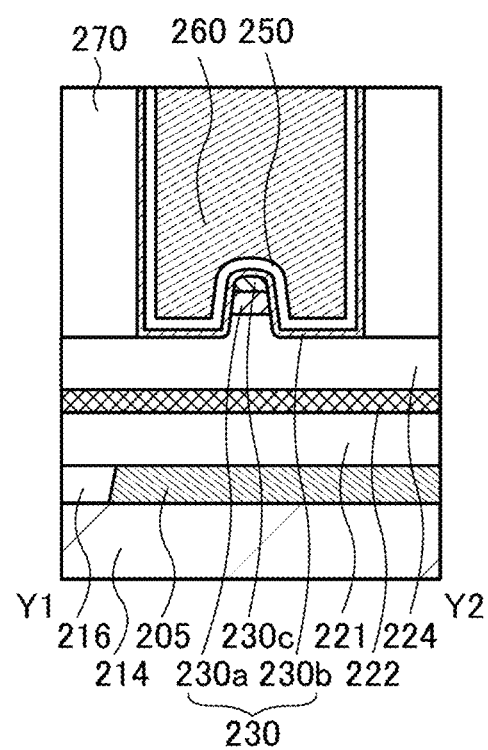

FIGS. 20A to 20C illustrate an example of a structure that can be used for the transistor 200. FIG. 20A illustrates a top surface of the transistor 200. For simplification of the figure, some films are omitted in FIG. 20A. FIG. 20B is a cross-sectional view taken along dashed-dotted line X1-X2 in FIG. 20A, and FIG. 20C is a cross-sectional view taken along dashed-dotted line Y1-Y2 in FIG. 20A.

Note that in the transistor 200 in FIGS. 20A to 20C, components having the same function as the components in the transistor 200 in FIGS. 18A to 18C are denoted by the same reference numerals.

In the structure illustrated in FIGS. 20A to 20C, the oxide 230c, the insulator 250, and the conductor 260 are formed in an opening formed in the insulator 280. In addition, one edge of each of the conductor 240a and the conductor 240b is aligned with the edge of the opening formed in the insulator 280. Furthermore, the edges of the conductor 240a and the conductor 240b on three sides are aligned with part of the edge of the oxide 230. Hence, the conductor 240a and the conductor 240b can be formed at the same time as the oxide 230 or the opening in the insulator 280. Accordingly, the number of masks and the steps can be reduced. Furthermore, yield and productivity can be improved.

Since the transistor 200 illustrated in FIGS. 20A to 20C has a structure in which the conductor 240a and the conductor 240b hardly overlap with the conductor 260, the parasitic capacitance added to the conductor 260 can be reduced. Thus, the transistor 200 with a high operation frequency can be provided.

In the structure, a region of the oxide 230b where a channel is formed can be electrically surrounded by an electric field of the conductor 260 which functions as a gate electrode. Because of the s-channel structure, the channel might be formed in the entire oxide 230b, which faces the conductor 260 with the insulator 250 provided therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

<Transistor Structure 4>

FIGS. 21A to 21C illustrate an example of a structure that can be used for the transistor 200. FIG. 21A illustrates a top surface of the transistor 200. For simplification of the figure, some films are omitted in FIG. 21A. FIG. 21B is a cross-sectional view taken along the dashed-dotted line X1-X2 in FIG. 21A, and FIG. 21C is a cross-sectional view taken along the dashed-dotted line Y1-Y2 in FIG. 21A.

Note that in the transistor 200 in FIGS. 21A to 21C, components having the same function as the components in the transistor 200 in FIGS. 18A to 18C are denoted by the same reference numerals.

In the structure illustrated in FIGS. 21A to 21C, the region 245a which functions as the one of the source region and the drain region and the region 245b which functions as the other of the source region and the drain region are provided in the oxide 230. The regions can be formed in such a manner that an impurity such as boron, phosphorus, or argon is added to the oxide 230 using the conductor 260 as a mask. Alternatively, the regions can be formed in such a manner that the insulator 280 is formed of an insulator containing hydrogen such as a silicon nitride film, and hydrogen is diffused to part of the oxide 230. Accordingly, the number of masks and the steps can be reduced. Furthermore, yield and productivity can be improved.

In the structure, a region of the oxide 230b where a channel is formed can be electrically surrounded by an electric field of the conductor 260 which functions as a gate electrode. Because of the s-channel structure, a channel might be formed in the entire oxide 230b, which faces the conductor 260 with the insulator 250 provided therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

The structures, the methods, and the like described in this embodiment can be combined as appropriate with any of the structures, the methods, and the like described in the other embodiments and examples.

Embodiment 4

In this embodiment, the oxide semiconductor included in the transistor described in the above embodiment will be described below with reference to FIGS. 22A to 22E, FIGS. 23A to 23E, FIGS. 24A to 24D, FIGS. 25A and 25B, and FIG. 26.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around $31\alpha$ as shown in FIG. 22A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\phi$ scan) is performed with $2\theta$ fixed at around 56° and with the sample rotated using a normal vector to the sample surface as an axis ($\phi$ axis), as shown in FIG. 22B, a peak is not clearly observed. In contrast, in the case where single crystal $InGaZnO_4$ is subjected to #scan with $2\theta$ fixed at around 56°, as shown in FIG. 22C, six peaks that are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 22D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 22E shows a diffraction pattern obtained in such a manner that an electron beam with a probe diameter of 300 nm is incident on the same sample in a direction perpendicular to the sample surface. As shown in FIG. 22E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 22E is considered to be derived from the (010) plane, the (100) plane, and the like of the $InGaZnO_4$ crystal. The second ring in FIG. 22E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the crystal grain boundary is less likely to occur.

Figure 23A:
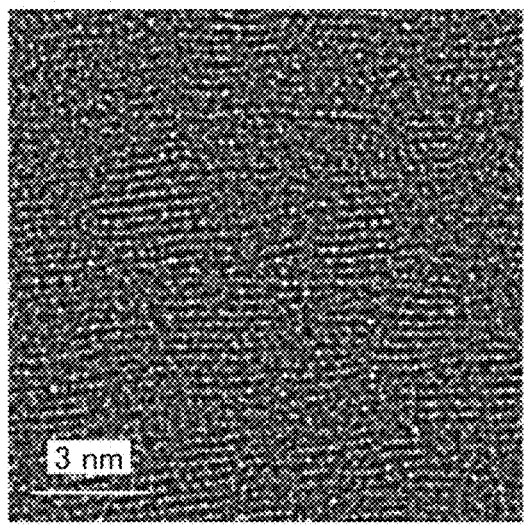
FIGS. 23A to 23E show a cross-sectional TEM image and plan-view TEM images of a CAAC-OS and images obtained through analysis thereof.

FIG. 23A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 23A shows pellets in which metal atoms are arranged in a layered manner. FIG. 23A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 23B:
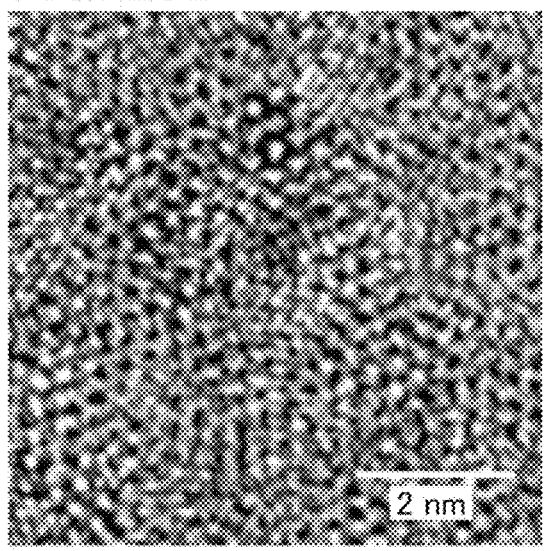
Figure 23C:
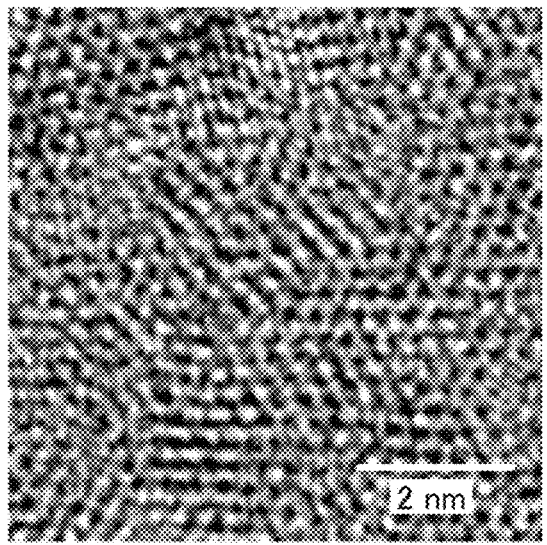
Figure 23D:
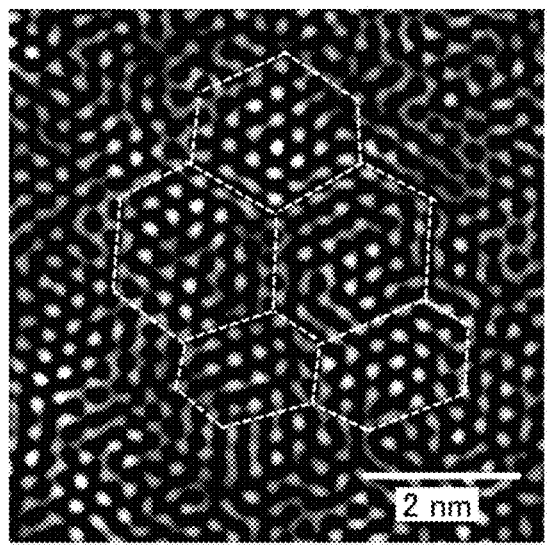
Figure 23E:
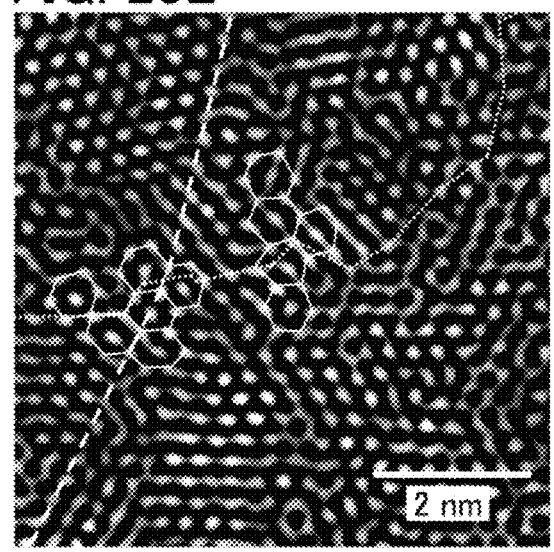

FIGS. 23B and 23C show Cs-corrected high-resolution TEM images of a plane of the CAAC-OS observed from a direction substantially perpendicular to the sample surface. FIGS. 23D and 23E are images obtained through image processing of FIGS. 23B and 23C. The method of image processing is as follows. The image in FIG. 23B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 23D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 23E, a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 24A:
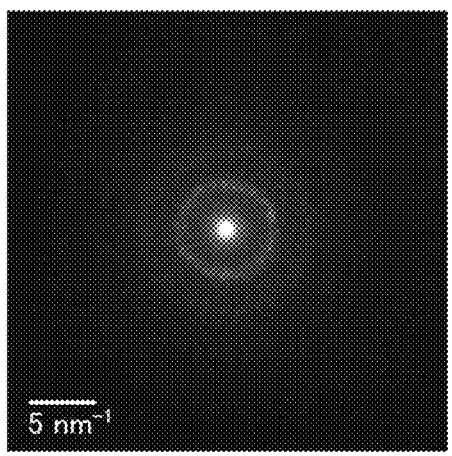
FIGS. 24A to 24D show electron diffraction patterns and a cross-sectional TEM image of an nc-OS.
Figure 24B:
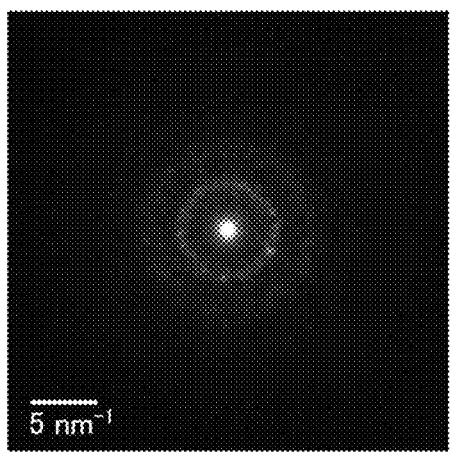

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 24A is observed. FIG. 24B shows a diffraction pattern (a nanobeam electron diffraction pattern) obtained when an electron beam with a probe diameter of 1 nm is incident on the same sample. As shown in FIG. 24B, a plurality of spots is observed in a ring-like region. In other words, ordering in an nc-OS is not observed with an electron beam with a probe diameter of 50 nm but is observed with an electron beam with a probe diameter of 1 nm.

Figure 24C:
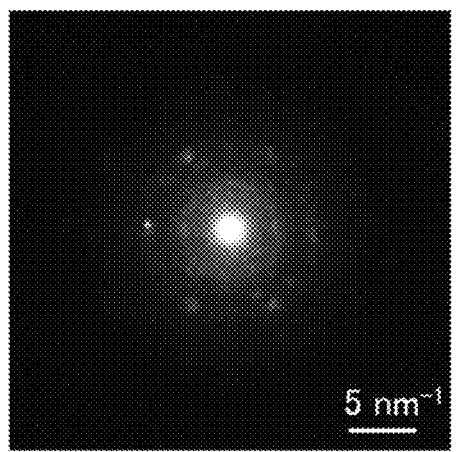

Furthermore, an electron diffraction pattern in which spots are arranged in an approximately regular hexagonal shape is observed in some cases as shown in FIG. 24C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 24D:
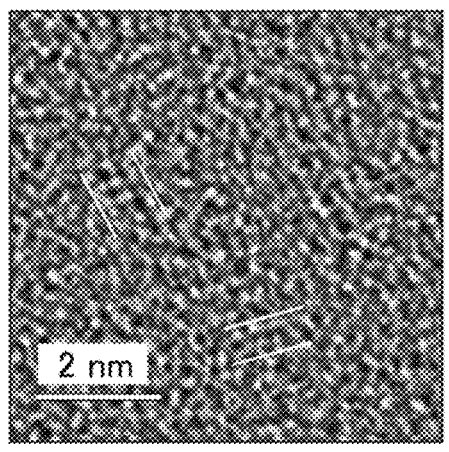

FIG. 24D shows a Cs-corrected high-resolution TEM image of a cross section of an nc-OS observed from a direction substantially parallel to the formation surface. In a high-resolution TEM image, an nc-OS has a region in which a crystal part is observed such as the part indicated by additional lines in FIG. 24D and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a crystal grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 25A:
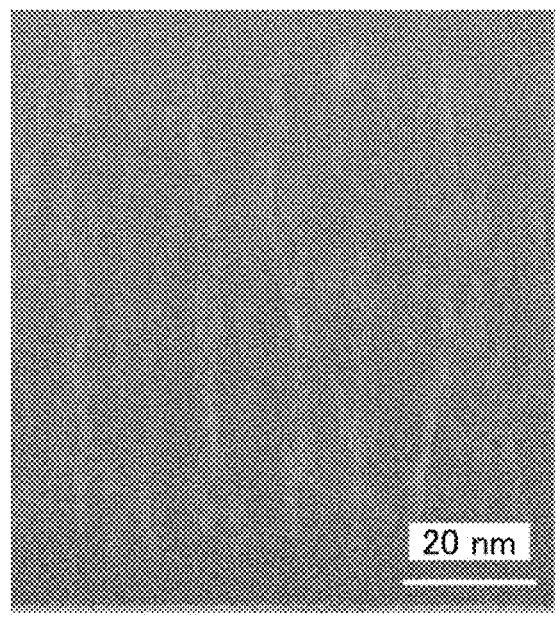
FIGS. 25A and 25B show cross-sectional TEM images of an a-like OS.
Figure 25B:
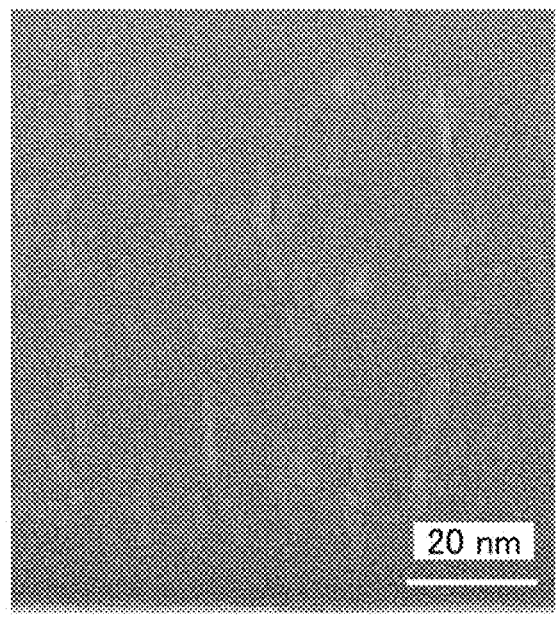

FIGS. 25A and 25B are high-resolution cross-sectional TEM images of an a-like OS. FIG. 25A is the high-resolution cross-sectional TEM image of the a-like OS at the start of the electron irradiation. FIG. 25B is the high-resolution cross-sectional TEM image of the a-like OS after the electron (e$^-$) irradiation at $4.3 \times 10^8$ e$^-$/nm$^2$. FIGS. 25A and 25B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 26:
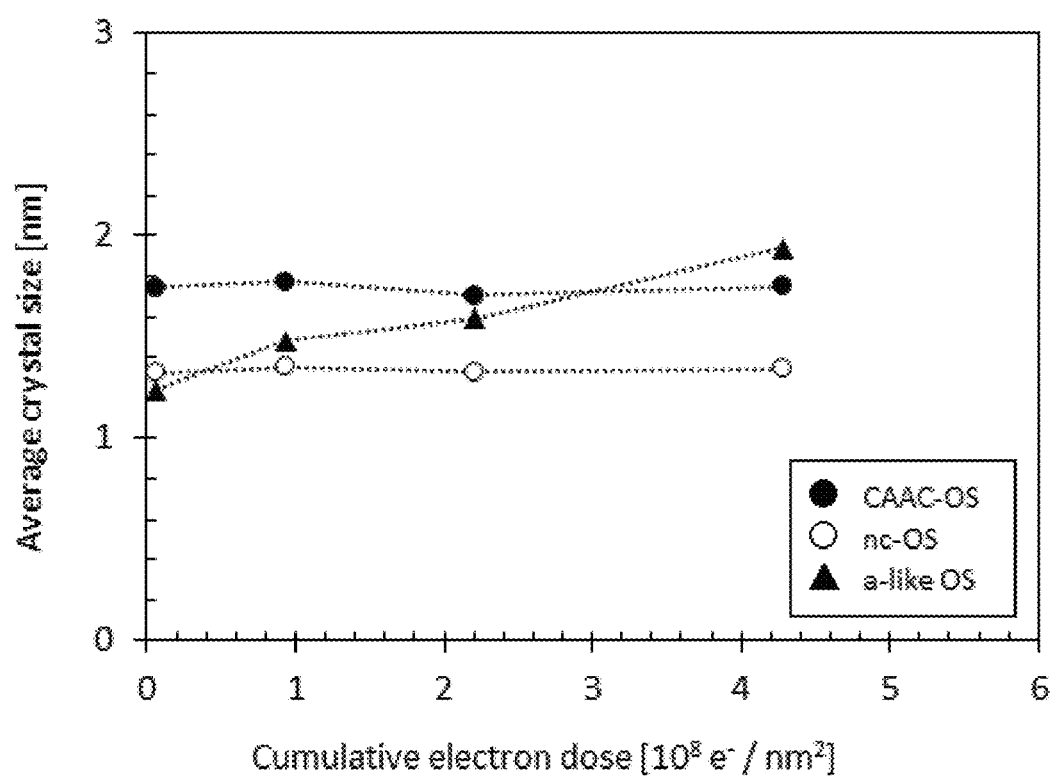
FIG. 26 shows a change in crystal part of an In—Ga—Zn oxide induced by electron irradiation.

FIG. 26 shows change in the average size of crystal parts (at 22 points to 30 points) in each sample. Note that the crystal part size corresponds to the length of a lattice fringe. FIG. 26 indicates that the crystal part size in the a-like OS increases with an increase in the cumulative electron dose in obtaining TEM images, for example. As shown in FIG. 26, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 26, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 5

In this embodiment, an example of a circuit of a semiconductor device including a transistor or the like according to one embodiment of the present invention is described.
<Memory Device>

Figure 27A:
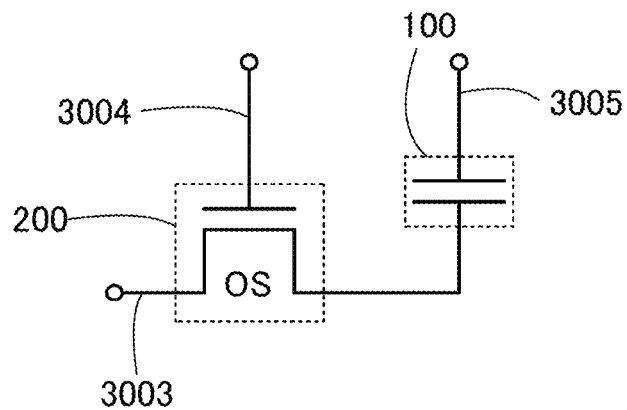
FIGS. 27A and 27B illustrate a circuit diagram and a cross-sectional view of a memory device according to one embodiments of the present invention.
Figure 27B:
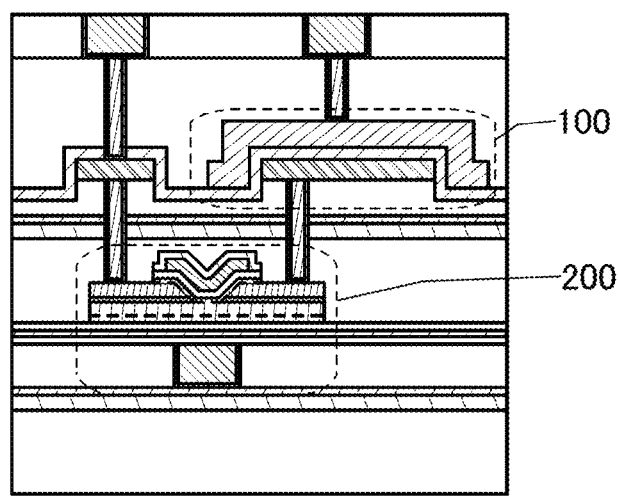

The semiconductor device in FIGS. 27A and 27B is different from the semiconductor device in FIGS. 6A to 6C in that the transistor 300 is not provided. Also in this case, data can be written and retained in a manner similar to that of the semiconductor device in FIGS. 6A to 6C.

Reading of data in the semiconductor device in FIG. 27B is described. When the transistor 200 is brought into on state, the wiring 3003 which is in a floating state and the capacitor 100 are brought into conduction, and the charge is redistributed between the wiring 3003 and the capacitor 100. As a result, the potential of the wiring 3003 is changed. The amount of change in the potential of the wiring 3003 varies depending on the potential of the one electrode of the capacitor 100 (or the charge accumulated in the capacitor 100).

For example, the potential of the wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the wiring 3003 in the case of retaining the potential $V_1$ ($=(C_B \times V_{B0} + C \times V_1)/(C_B + C)$) is higher than the potential of the wiring 3003 in the case of retaining the potential $V_0$ ($=(C_B \times V_{B0} + C \times V_0)/(C_B + C)$).

Then, by comparing the potential of the wiring 3003 with a predetermined potential, data can be read.

In this case, a transistor including the oxide semiconductor may be used for a driver circuit for driving a memory cell, and a transistor including the other semiconductor may be stacked over the driver circuit as the transistor 300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device according to one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

Embodiment 6

In this embodiment, examples of CPUs including semiconductor devices such as the transistor according to one embodiment of the present invention and the above-described memory device will be described.
<Structure of CPU>

Figure 28:
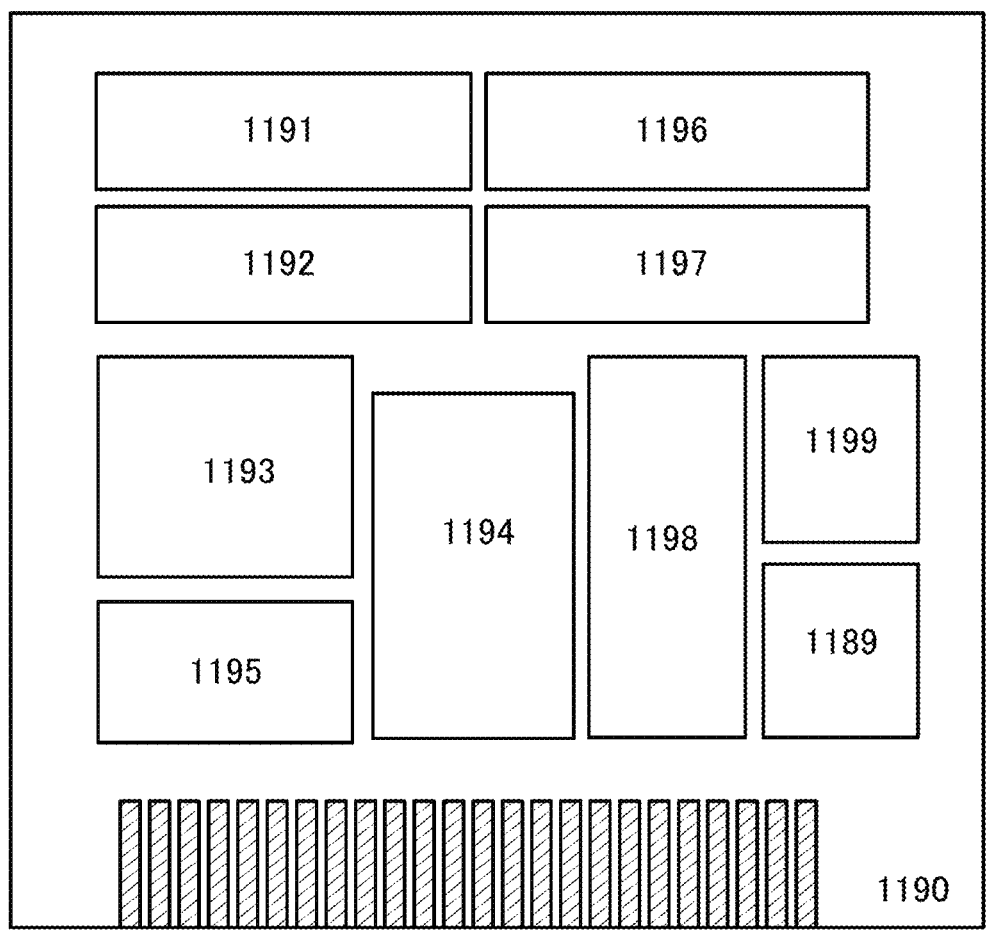
FIG. 28 is a block diagram illustrating a semiconductor device according to one embodiment of the present invention.

FIG. 28 is a block diagram illustrating a configuration example of a CPU including any of the above-described transistors as a component.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration has been simplified, and an actual CPU has various configurations depending on the application. For example, the CPU may have the following configuration: a structure including the CPU illustrated in FIG. 28 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 28, a memory cell is provided in the register 1196. For the memory cell of the register 1196, any of the above-described transistors, the above-described memory device, or the like can be used.

In the CPU illustrated in FIG. 28, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 29:
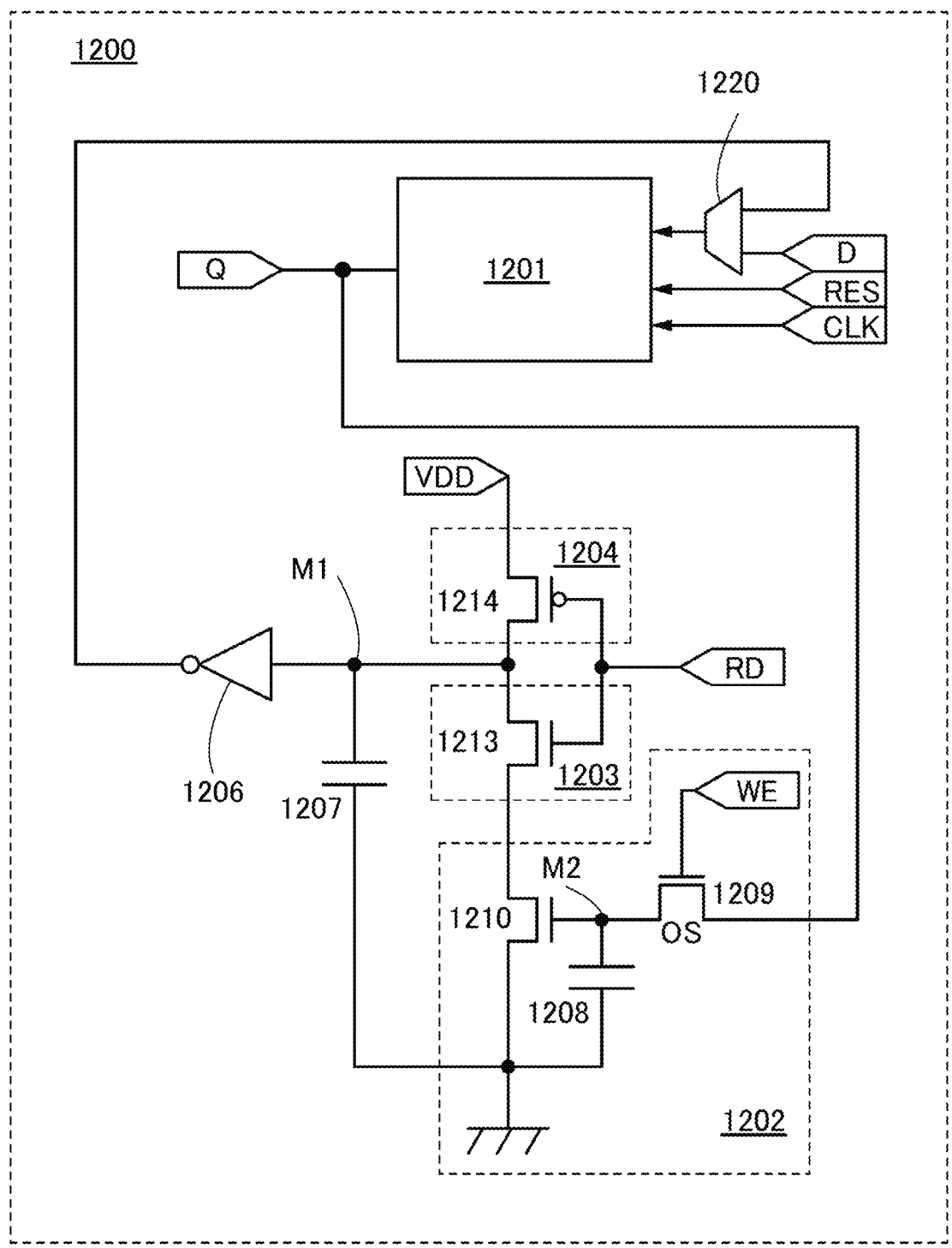
FIG. 29 is a block diagram illustrating a semiconductor device according to one embodiment of the present invention.

FIG. 29 is an example of a circuit diagram of a memory element 1200 that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 29 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 29, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 29, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer using a semiconductor other than an oxide semiconductor or in the substrate 1190 can be used for the rest of the transistors.

As the circuit 1201 in FIG. 29, for example, a flip-flop circuit can be used. As the logic element 1206, for example, an inverter or a clocked inverter can be used.

In a period during which the memory element 1200 is not supplied with the power supply voltage, the semiconductor device according to one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (on state or the off state) is determined depending on the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP), or a custom LSI, and a radio frequency (RF) device. The memory element 1200 can also be used in an LSI such as a programmable logic circuit including a field programmable gate array (FPGA) or a complex programmable logic device (CPLD).

The structure described in this embodiment can be used in appropriate combination with the structure described in any of the other embodiments.

Embodiment 7

In this embodiment, display devices each including the transistor or the like according to one embodiment of the present invention will be described with reference to FIGS. 30A to 30C and FIGS. 31A and 31B.

<Structure of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 30A:
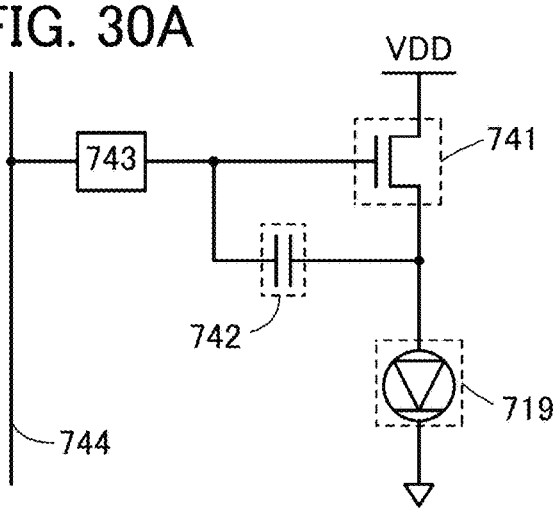
FIGS. 30A to 30C are a circuit diagram, a top view, and a cross-sectional view illustrating a semiconductor device according to one embodiment of the present invention.
Figure 30B:
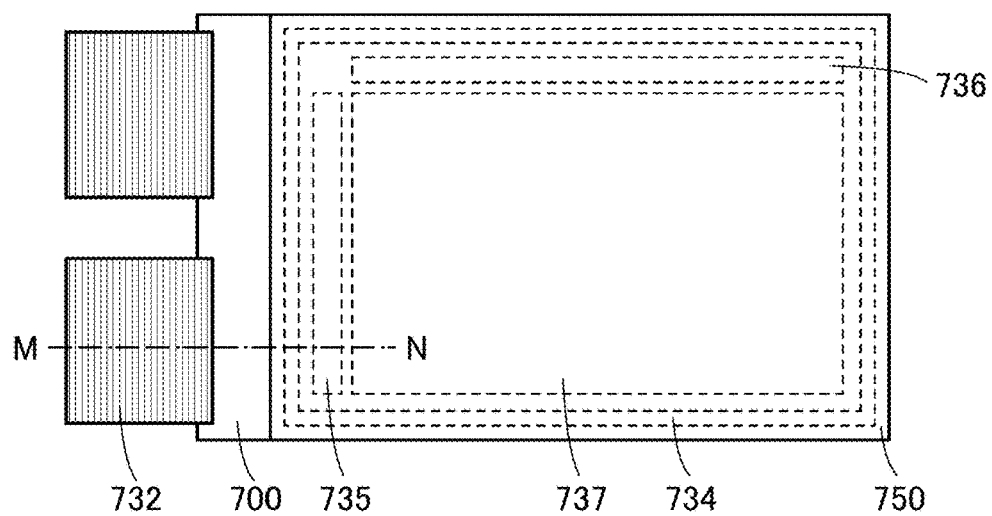
Figure 30C:
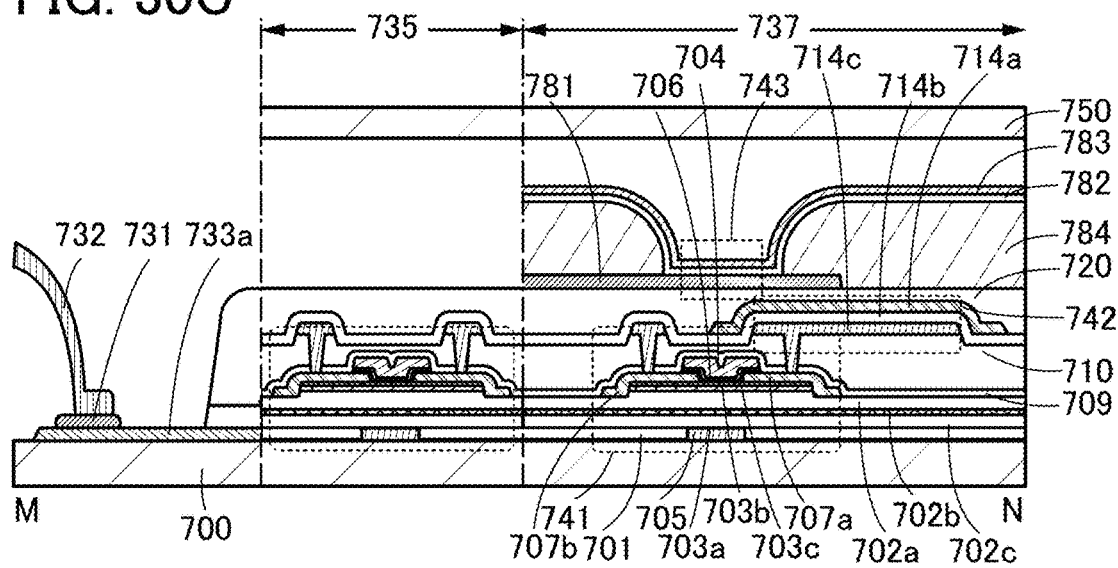

FIGS. 30A to 30C illustrate an example of an EL display device of one embodiment of the present invention. FIG. 30A is a circuit diagram of a pixel in an EL display device. FIG. 30B is a top view showing the whole of the EL display device. FIG. 30C is a cross-sectional view taken along part of dashed-dotted line M-N in FIG. 30B.

FIG. 30A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 30A includes a switching element 743, a transistor 741, a capacitor 742, and a light-emitting element 719.

Note that FIG. 30A and the like each illustrate an example of a circuit structure; therefore, a transistor can be provided additionally. In contrast, for each node in FIG. 30A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a source of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the transistor above can be used, for example.

FIG. 30B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 30C is a cross-sectional view of the EL display device taken along part of dashed-dotted line M-N in FIG. 30B.

FIG. 30C illustrates a structure of the transistor 741 including a conductor 705 over the substrate 700; an insulator 701 in which the conductor 705 is embedded; an insulator 702a, an insulator 702b, and an insulator 702c over the insulator 701, a semiconductor 703a, a semiconductor 703b, and a semiconductor 703c over the insulator 702c, a conductor 707a and a conductor 707b over the semiconductor 703b, an insulator 706 over the semiconductor 703c, and a conductor 704 over the insulator 706. Note that the structure of the transistor 741 is just an example; the transistor 741 may have a structure different from that illustrated in FIG. 30C.

Therefore, in the transistor 741 illustrated in FIG. 30C, the conductor 704 and the conductor 705 each function as a gate electrode, the insulator 702 and the insulator 706 each function as a gate insulator, and the conductor 707a and the conductor 707b function as a source electrode and a drain electrode. Note that in some cases, electric characteristics of the semiconductor 703 change if light enters the semiconductor 703. To prevent this, it is preferable that one or more of the conductor 705 and the conductor 704 have a light-blocking property.

FIG. 30C illustrates a structure of the capacitor 742 including a conductor 714a over an insulator 710, an insulator 714b over the conductor 714a, and a conductor 714c over the insulator 714b.

In the capacitor 742, the conductor 714a functions as one electrode and the conductor 714c functions as the other electrode.

The capacitor 742 illustrated in FIG. 30C has a large capacitance per area occupied by the capacitor. Therefore, the EL display device illustrated in FIG. 30C has high display quality.

An insulator 720 is provided over the transistor 741 and the capacitor 742. Here, the insulator 710 may have an opening reaching the conductor 707a and the conductor 707b that functions as the source electrode of the transistor 741. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 31A:
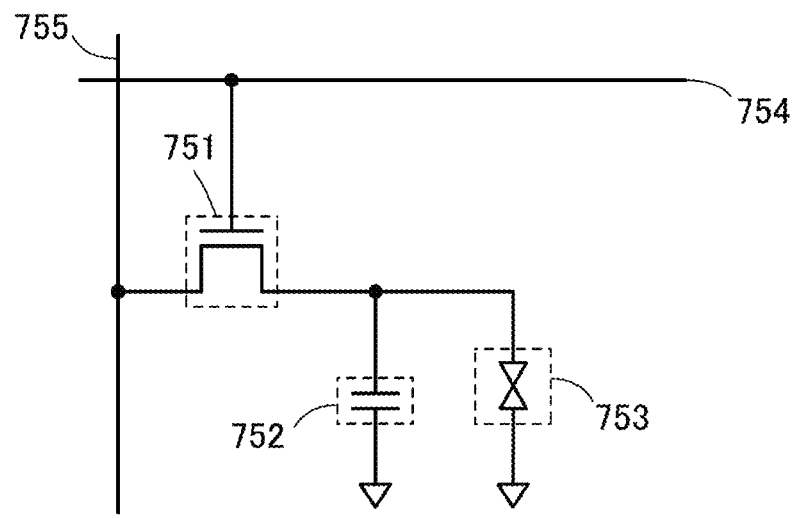
FIGS. 31A and 31B are a circuit diagram and a cross-sectional view illustrating a semiconductor device according to one embodiment of the present invention.

FIG. 31A is a circuit diagram showing a structural example of a pixel of the liquid crystal display device. A pixel illustrated in FIG. 31A includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 31B:
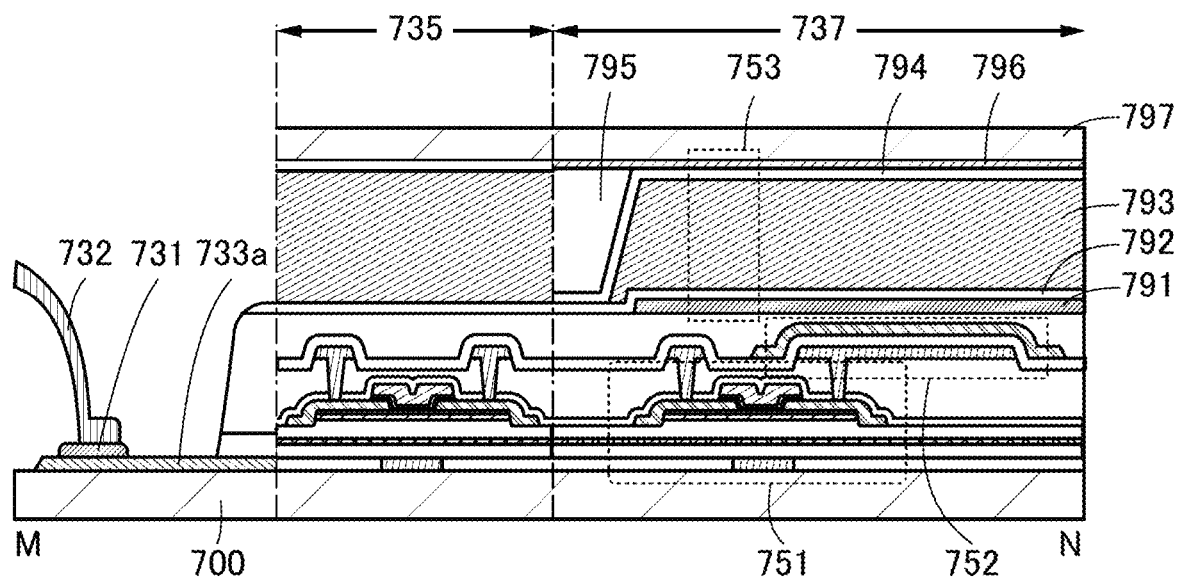

Note the description of the liquid crystal display device is made on the assumption that the top view of the liquid crystal display device is similar to that of the EL display device. FIG. 30B is a cross-sectional view of the liquid crystal display device taken along dashed-dotted line M-N in FIG. 31B. In FIG. 31B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 31B corresponds to, but is not limited to, the structure of the capacitor 742 in FIG. 30C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 720 is provided over the transistor 751 and the capacitor 752. A conductor 791 is provided over the insulator 720. The conductor 791 is electrically connected to the transistor 751 through the opening in the insulator 720.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electronic ink or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structure described in this embodiment can be combined as appropriate with any of the structures described in the other embodiments.

Embodiment 8

In this embodiment, electronic devices each including the transistor or the like according to one embodiment of the present invention are described.

<Electronic Device>

The semiconductor device according to one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic appliances that can be equipped with the semiconductor device according to one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 32A to 32F illustrate specific examples of these electronic devices.

Figure 32A:
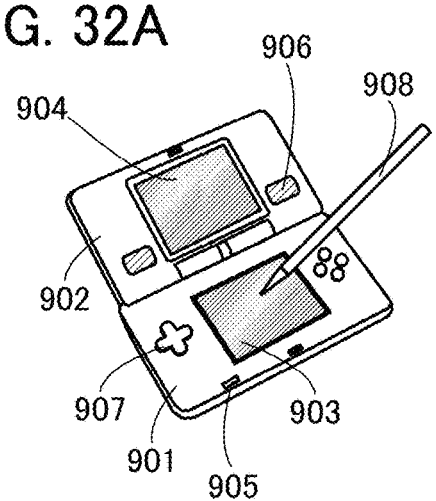
FIGS. 32A to 32F are perspective views each illustrating an electronic device according to one embodiment of the present invention.

FIG. 32A illustrates a portable game machine including a housing 901, a housing 902, a display portion 903, a display portion 904, a microphone 905, a speaker 906, an operation key 907, a stylus 908, and the like. Although the portable game machine in FIG. 32A has the two display portions 903 and 904, the number of display portions included in a portable game machine is not limited to this.

Figure 32B:
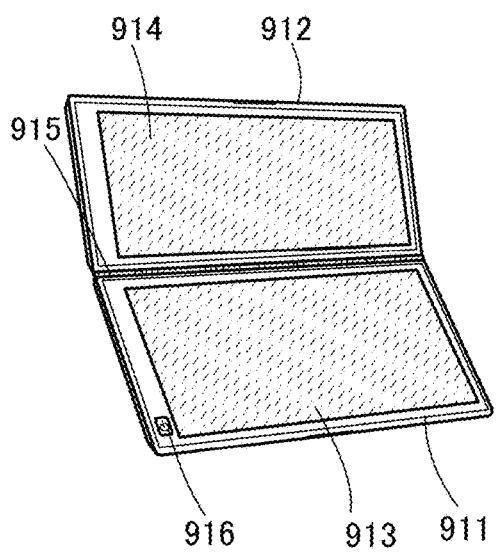

FIG. 32B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 32C:
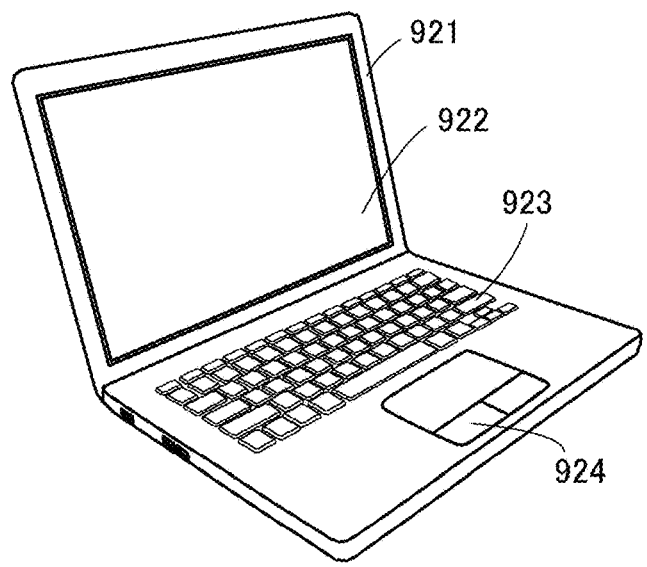

FIG. 32C illustrates a laptop personal computer, which includes a housing 921, a display portion 922, a keyboard 923, a pointing device 924, and the like.

Figure 32D:
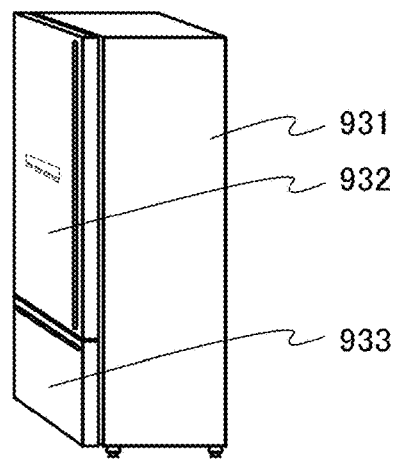

FIG. 32D illustrates an electric refrigerator-freezer including a housing 931, a door for a refrigerator 932, a door for a freezer 933, and the like.

Figure 32E:
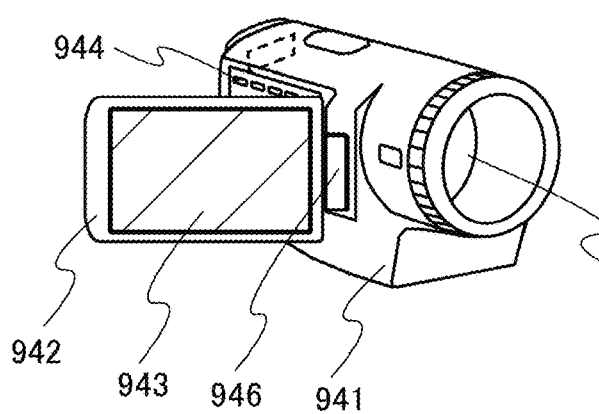

FIG. 32E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 32F:
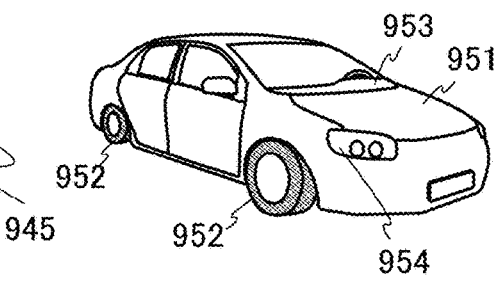

FIG. 32F illustrates a passenger car, which includes a car body 951, wheels 952, a dashboard 953, lights 954, and the like.

The structure described in this embodiment can be used in appropriate combination with the structure described in any of the other embodiments.

Embodiments of the present invention have been described in the above embodiments. Note that one embodiment of the present invention is not limited to the above examples. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

This application is based on Japanese Patent Application serial no. 2015-235300 filed with Japan Patent Office on Dec. 2, 2015, the entire contents of which are hereby incorporated by reference.

What is claimed is:

1. A semiconductor device comprising:
a first transistor over a substrate;
a second transistor over the first transistor, the second transistor having a channel formation region comprising an oxide semiconductor;
a first insulating layer over the second transistor; and
a capacitor over the first insulating layer, the capacitor comprising a first conductive layer in contact with a first region of the first insulating layer, a second insulating layer over and in contact with the first conductive layer and a second region of the first insulating layer, and a second conductive layer over and in contact with the second insulating layer,
wherein the second insulating layer has a first part being in contact with the first conductive layer and a second part being in contact with the second region of the first insulating layer, and
wherein a bottom surface of the first conductive layer is higher than a top surface of the second part of the second insulating layer.

2. The semiconductor device according to claim 1,
wherein the second insulating layer has a stacked-layer structure of a first layer comprising a first material and a second layer comprising a second material,
wherein the first material is higher dielectric strength than the second material, and
wherein the second material is higher dielectric constant than the first material.

3. The semiconductor device according to claim 1, wherein the first conductive layer is electrically connected to one of a source electrode and a drain electrode of the second transistor via a third conductive layer.

4. The semiconductor device according to claim 1, wherein the first conductive layer is electrically connected to a gate electrode of the first transistor via a fourth conductive layer.

5. The semiconductor device according to claim 1, wherein the second conductive layer covers a side surface of the first conductive layer with the second insulating layer provided therebetween.

6. The semiconductor device according to claim 1, wherein a thickness of the first region of the first insulating layer is thicker than a thickness of the second region of the first insulating layer.

7. The semiconductor device according to claim 1, wherein the oxide semiconductor comprises an In—M—Zn oxide (M is one of Al, Ga, Y, and Sn).

8. An electronic device comprising:
the semiconductor device according to claim 1; and
at least one of a battery, an antenna, a housing, and an operation switch.

9. A semiconductor device comprising:
a first transistor over a semiconductor substrate, the first transistor having a channel formation region comprising a part of the semiconductor substrate;
a second transistor over the first transistor, the second transistor having a channel formation region comprising an oxide semiconductor;
a first insulating layer over the second transistor; and
a capacitor over the first insulating layer, the capacitor comprising a first conductive layer in contact with a first region of the first insulating layer, a second insulating layer over and in contact with the first conductive layer and a second region of the first insulating layer, and a second conductive layer over and in contact with the second insulating layer, wherein the second insulating layer has a first part being in contact with the first conductive layer and a second part being in contact with the second region of the first insulating layer, and wherein a bottom surface of the first conductive layer is higher than a top surface of the second part of the second insulating layer.

10. The semiconductor device according to claim 9, wherein the second insulating layer has a stacked-layer structure of a first layer comprising a first material and a second layer comprising a second material, wherein the first material is higher dielectric strength than the second material, and wherein the second material is higher dielectric constant than the first material.

11. The semiconductor device according to claim 9, wherein the first conductive layer is electrically connected to one of a source electrode and a drain electrode of the second transistor via a third conductive layer.

12. The semiconductor device according to claim 9, wherein the first conductive layer is electrically connected to a gate electrode of the first transistor via a fourth conductive layer.

13. The semiconductor device according to claim 9, wherein the second conductive layer covers a side surface of the first conductive layer with the second insulating layer provided therebetween.

14. The semiconductor device according to claim 9, wherein a thickness of the first region of the first insulating layer is thicker than a thickness of the second region of the first insulating layer.

15. The semiconductor device according to claim 9, wherein the oxide semiconductor comprises an In-M-Zn oxide (M is one of Al, Ga, Y, and Sn).

16. An electronic device comprising:
the semiconductor device according to claim 9; and
at least one of a battery, an antenna, a housing, and an operation switch.

* * * * *